US006639268B2

(12) United States Patent
Forbes et al.

(10) Patent No.: US 6,639,268 B2
(45) Date of Patent: *Oct. 28, 2003

(54) FLASH MEMORY WITH ULTRA THIN VERTICAL BODY TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/152,649

(22) Filed: May 20, 2002

(65) Prior Publication Data

US 2002/0137271 A1 Sep. 26, 2002

Related U.S. Application Data

(62) Division of application No. 09/780,169, filed on Feb. 9, 2001.

(51) Int. Cl.[7] .................... H01L 29/788; H01L 27/01; H01L 27/12; H01L 31/0392
(52) U.S. Cl. ...................... 257/315; 257/353
(58) Field of Search ................. 257/315, 353

(56) References Cited

U.S. PATENT DOCUMENTS

| | | | | |
|---|---|---|---|---|
| 5,460,988 A | 10/1995 | Hong | ................ | 437/43 |
| 5,696,008 A | 12/1997 | Tamaki et al. | ................ | 437/40 |
| 5,874,760 A | 2/1999 | Burns, Jr. et al. | ............ | 257/315 |
| 5,936,274 A | 8/1999 | Forbes et al. | ................ | 257/315 |
| 5,973,352 A | 10/1999 | Noble | ................ | 257/315 |
| 5,973,356 A | 10/1999 | Noble et al. | ................ | 257/319 |
| 5,991,225 A | 11/1999 | Forbes et al. | .......... | 365/230.06 |
| 6,072,209 A | 6/2000 | Noble et al. | ................ | 257/296 |
| 6,124,729 A | 9/2000 | Noble et al. | ................ | 326/41 |
| 6,143,636 A | 11/2000 | Forbes et al. | ................ | 438/587 |
| 6,150,687 A | 11/2000 | Noble et al. | ................ | 257/302 |
| 6,153,468 A | 11/2000 | Forbes et al. | ................ | 438/257 |
| 6,238,976 B1 | 5/2001 | Noble et al. | ................ | 438/259 |
| 6,377,070 B1 * | 4/2002 | Forbes | ................ | 326/41 |
| 6,424,001 B1 * | 7/2002 | Forbes et al. | ................ | 257/315 |
| 2002/0109138 A1 * | 8/2002 | Forbes | ................ | 257/51 |

OTHER PUBLICATIONS

Hergenrother, J..M. ,"The Vertical Replacement–Gate (VRG) MOSFET: A 50nm Vertical MOSFET with Lithography–Independent Gate Length", *IEEE*, (1999),pp. 75–78.

Kalavade, P..,et al. ,"A Novel sub–10nm Transistor", *IEEE Device Research Conference*, Denver, Co.,(2000),pp. 71–72.

Xuan, P..,et al. ,"60nm Planarized Ultra–thin Body Solid Phase Epitaxy MOSFETs", *IEEE Device Research Conference*, Denver, CO,(2000),pp. 67–68.

* cited by examiner

Primary Examiner—Wael Fahmy
Assistant Examiner—Howard Weiss
(74) Attorney, Agent, or Firm—Schwegman, Lundberg, Woessner & Kluth, P.A.

(57) ABSTRACT

Structures and method for Flash memory with ultra thin vertical body transistors are provided. The Flash memory includes an array of memory cells including floating gate transistors. Each floating gate transistor includes a pillar extending outwardly from a semiconductor substrate. The pillar includes a single crystalline first contact layer and a second contact layer vertically separated by an oxide layer. A single crystalline vertical transistor is formed along side of the pillar. The single crystalline vertical transistor includes an ultra thin single crystalline vertical body region which separates an ultra thin single crystalline vertical first source/drain region and an ultra thin single crystalline vertical second source/drain region. A floating gate opposes the ultra thin single crystalline vertical body region, and a control gate separated from the floating gate by an insulator layer.

49 Claims, 17 Drawing Sheets

FLASH MEMORY WITH ULTRA THIN VERTICAL BODY TRANSISTORS

CROSS REFERENCE TO RELATED APPLICATIONS

This application is a division of U.S. application Ser. No. 09/780,169, filed on Feb. 9, 2001, the specification of which is incorporated herein by reference.

This application is related to the following co-pending, commonly assigned U.S. patent applications: U.S. application Ser. No. 09/780,125, filed on Feb. 9, 2001, entitled "Open Bit Line DRAM with Ultra Thin Body Transistors," U.S. application Ser. No. 09/780,130, filed on Feb. 9, 2001, entitled "Folded Bit Line DRAM with Ultra Thin Body Transistors," U.S. application Ser. No. 09/780,087, filed on Feb. 9, 2001, entitled "Programmable Logic Arrays with Ultra Thin Body Transistors," U.S. application Ser. No. 09/780,144, filed on Feb. 9, 2001, entitled "Memory Address and Decode Circuits with Ultra Thin Body Transistors," and U.S. application Ser. No. 09/780,126, filed on Feb. 9, 2001, entitled "Programmable Memory Address and Decode Circuits with Ultra Thin Body Transistors," and U.S. application Ser. No. 09/780,129, filed on Feb. 9, 2001, now issued as U.S. Pat. No. 6,377,070, the disclosures of which are herein incorporated by reference.

FIELD OF THE INVENTION

The present invention relates generally to integrated circuits, and in particular to Flash memory with ultra thin vertical body transistors.

BACKGROUND OF THE INVENTION

Semiconductor memories, such as dynamic random access memories (DRAMs), are widely used in computer systems for storing data. A DRAM memory cell typically includes an access field-effect transistor (FET) and a storage capacitor. The access FET allows the transfer of data charges to and from the storage capacitor during reading and writing operations. The data charges on the storage capacitor are periodically refreshed during a refresh operation.

Memory density is typically limited by a minimum lithographic feature size (F) that is imposed by lithographic processes used during fabrication. For example, the present generation of high density dynamic random access memories (DRAMs), which are capable of storing 256 Megabits of data, require an area of $8F^2$ per bit of data. There is a need in the art to provide even higher density memories in order to further increase data storage capacity and reduce manufacturing costs. Increasing the data storage capacity of semiconductor memories requires a reduction in the size of the access FET and storage capacitor of each memory cell. However, other factors, such as subthreshold leakage currents and alpha-particle induced soft errors, require that larger storage capacitors be used. Thus, there is a need in the art to increase memory density while allowing the use of storage capacitors that provide sufficient immunity to leakage currents and soft errors. There is also a need in the broader integrated circuit art for dense structures and fabrication techniques.

Flash memory cells are one possible solution for high density memory requirements. Flash memories include a single transistor, and with high densities would have the capability of replacing hard disk drive data storage in computer systems. This would result in delicate mechanical systems being replaced by rugged, small and durable solid-state memory packages, and constitute a significant advantage in computer systems. What is required then is a flash memory with the highest possible density or smallest possible cell area.

The continuous scaling, however, poses problems even for flash memories since the single transistor in the flash memory has the same design rule limitations of conventional MOSFET technology. That is, the continuous scaling to the deep sub-micron region where channel lengths are less than 0.1 micron, 100 nm, or 1000 Å causes significant problems in the conventional transistor structures. As shown in FIG. 1, junction depths should be much less than the channel length of 1000 Å, or this implies junction depths of a few hundred Angstroms. Such shallow junctions are difficult to form by conventional implantation and diffusion techniques. Extremely high levels of channel doping are required to suppress short-channel effects such as drain-induced barrier lowering; threshold voltage roll off, and sub-threshold conduction. Sub-threshold conduction is particularly problematic in MOSFET technology as it reduces the charge storage retention time on the capacitor cells. These extremely high doping levels result in increased leakage and reduced carrier mobility. Thus making the channel shorter to improve performance is negated by lower carrier mobility.

Therefore, there is a need in the art to provide improved flash memory densities while avoiding the deleterious effects of short-channel effects such as drain-induced barrier lowering; threshold voltage roll off, and sub-threshold conduction, increased leakage and reduced carrier mobility. At the same time charge storage retention time must be maintained.

SUMMARY OF THE INVENTION

The above mentioned problems with semiconductor memories and other problems are addressed by the present invention and will be understood by reading and studying the following specification. Systems and methods are provided for transistors with ultra thin bodies, or transistors where the surface space charge region scales down as other transistor dimensions scale down.

In one embodiment of the present invention, the Flash memory includes an array of memory cells including floating gate transistors. Each floating gate transistor includes a pillar extending outwardly from a semiconductor substrate. The pillar includes a single crystalline first contact layer and a second contact layer vertically separated by an oxide layer. A single crystalline vertical transistor is formed along side of the pillar. The single crystalline vertical transistor includes an ultra thin single crystalline vertical body region which separates an ultra thin single crystalline vertical first source/drain region and an ultra thin single crystalline vertical second source/drain region. A floating gate opposes the ultra thin single crystalline vertical body region, and a control gate separated from the floating gate by an insulator layer.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
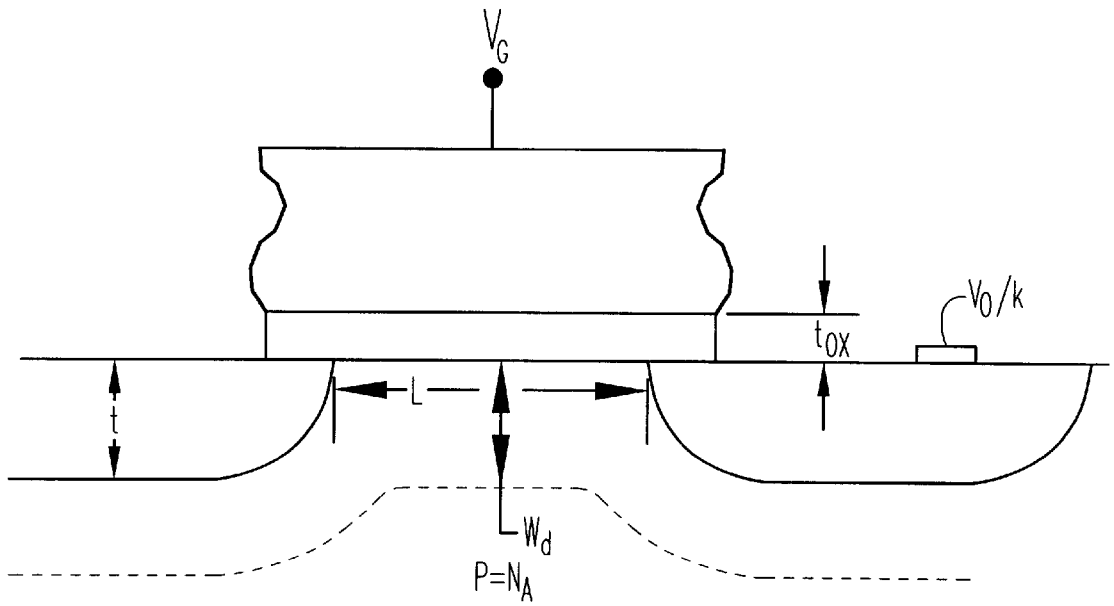
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 Å.
Figure 2:
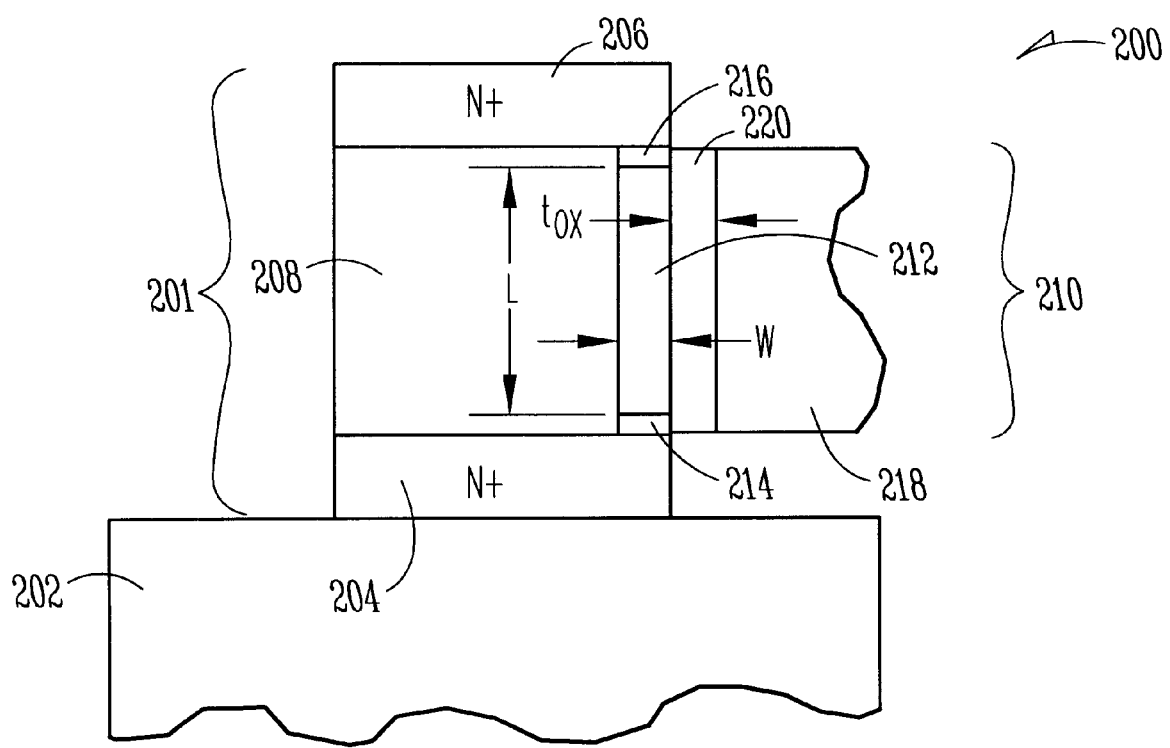
FIG. 2 is a diagram illustrating a vertical ultra thin body transistor formed along side of a pillar according to the teachings of the present invention.

FIG. 2 is a diagram illustrating an ultra thin single crystalline vertical transistor, or access FET 200 formed according to the teachings of the present invention. As shown in FIG. 2, access FET 200 includes a vertical ultra thin body transistor, or otherwise stated an ultra thin single crystalline vertical transistor. According to the teachings of the present invention, the structure of the access FET 200 includes a pillar 201 extending outwardly from a semiconductor substrate 202. The pillar includes a single crystalline first contact layer 204 and a second contact layer 206 vertically separated by an oxide layer 208. An ultra thin single crystalline vertical transistor 210 is formed along side of the pillar 201. The ultra thin single crystalline vertical transistor 210 includes an ultra thin single crystalline vertical body region 212 which separates an ultra thin single crystalline vertical first source/drain region 214 and an ultra thin single crystalline vertical second source/drain region 216. The an ultra thin single crystalline vertical first source/drain region 214 is coupled to the first contact layer 204 and the ultra thin single crystalline vertical second source/drain region 216 is coupled to the second contact layer. A gate 218 is formed opposing the ultra thin single crystalline vertical body region 212 and is separated therefrom by a thin gate oxide layer 220.

According to embodiments of the present invention, the ultra thin single crystalline vertical transistor 210 includes a transistor having a vertical length of less than 100 nanometers and a horizontal width of less than 10 nanometers. Thus, in one embodiment, the ultra thin single crystalline vertical body region 212 includes a channel having a vertical length (L) of less than 100 nanometers. Also, the ultra thin single crystalline vertical body region 212 has a horizontal width (W) of less than 10 nanometers. And, the ultra thin single crystalline vertical first source/drain region 214 and an ultra thin single crystalline vertical second source/drain region 216 have a horizontal width of less than 10 nanometers. According to the teachings of the present invention, the ultra thin single crystalline vertical transistor 210 is formed from solid phase epitaxial growth.

As one of ordinary skill in the art will understand upon reading this disclosure, the ultra thin single crystalline vertical transistors with ultra thin bodies of the present invention provide a surface space charge region which scales down as other transistor dimensions scale down. This structure of the invention facilitates increasing density and design rule demands while suppressing short-channel effects such as drain-induced barrier lowering; threshold voltage roll off, and sub-threshold conduction.

An n-channel type transistor is shown in the embodiment of FIG. 2. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Figure 3A:
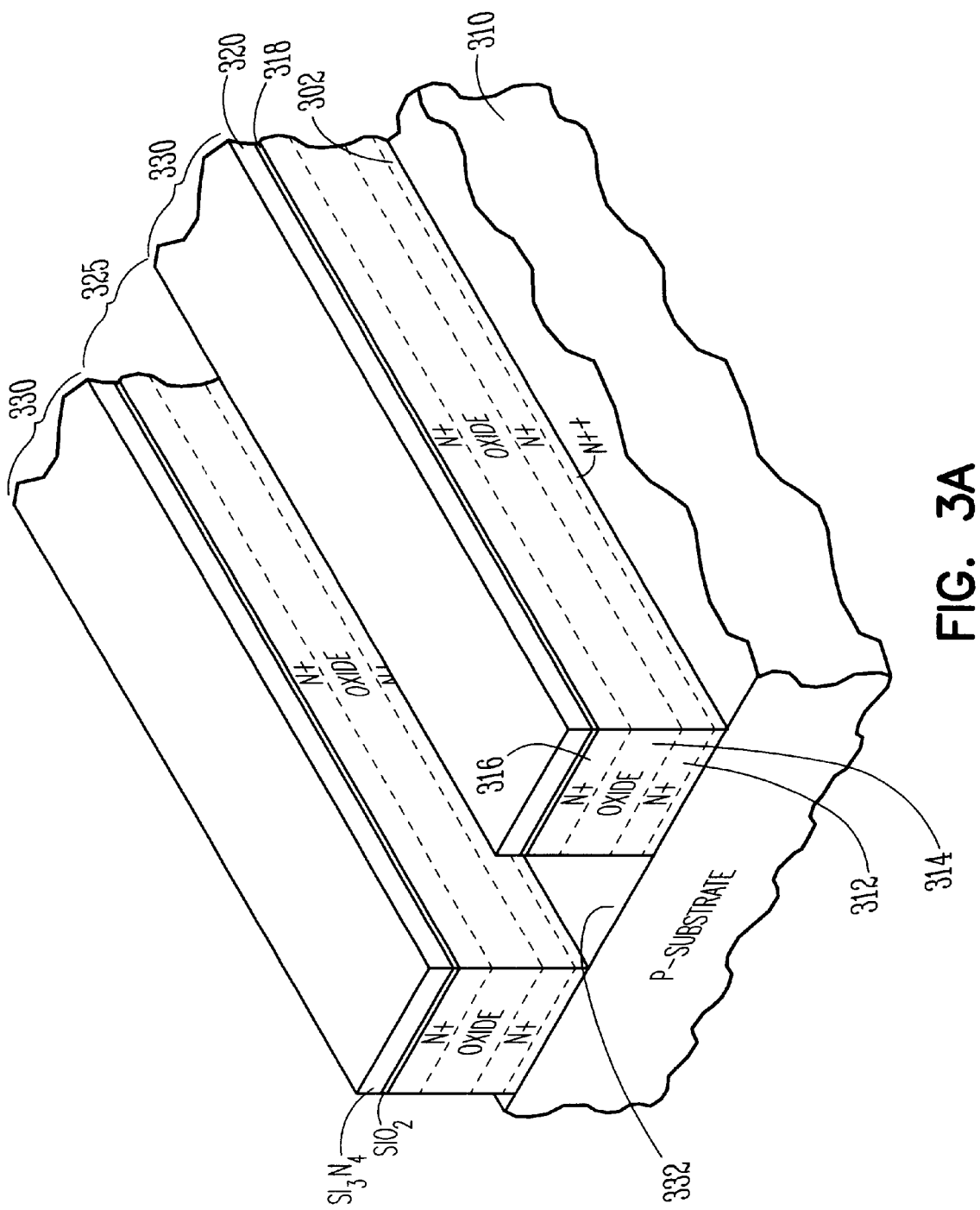
FIGS. 3A–3C illustrate an initial process sequence which for forming pillars along side of which vertical ultra thin body transistors can later be formed according to the teachings of the present invention.
Figure 3B:
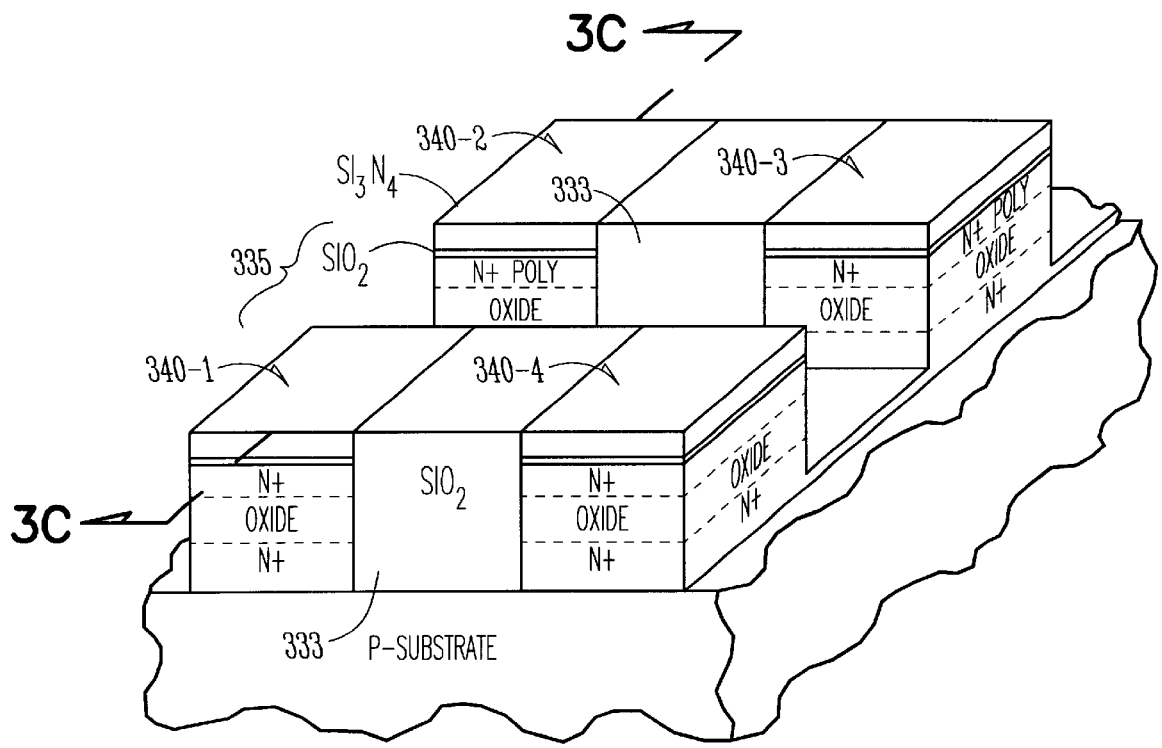
Figure 3C:
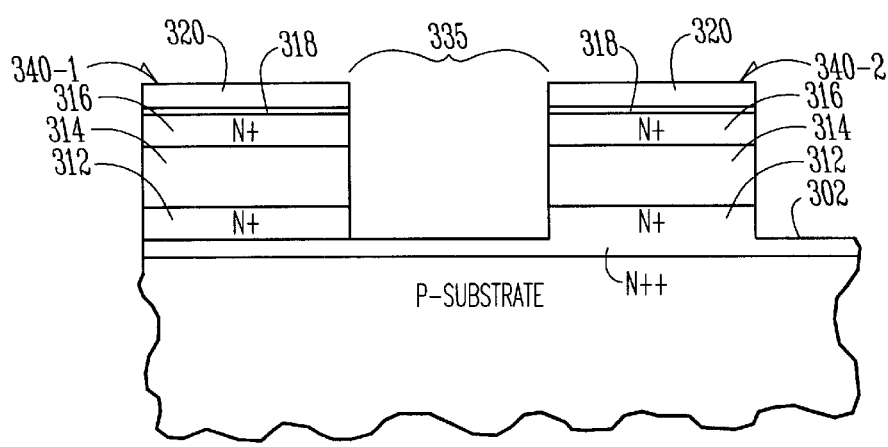

FIGS. 3A–3C illustrate an initial process sequence for forming pillars along side of which vertical ultra thin body transistors can later be formed as part of forming a flash memory cell according to the teachings of the present invention. The dimensions suggested are appropriate to a 0.1 µm cell dimension (CD) technology and may be scaled accordingly for other CD sizes. In the embodiment of FIG. 3A, a p-type bulk silicon substrate 310 starting material is used. An n++ and n+ silicon composite first contact layer 312 is formed on substrate 310, such as by ion-implantation, epitaxial growth, or a combination of such techniques to form a single crystalline first contact layer 312. According to the teachings of the present invention, the more heavily conductively doped lower portion of the first contact layer 312 also functions as the bit line 302. The thickness of the n++ portion of first contact layer 312 is that of the desired bit line 302 thickness, which can be approximately between 0.1 to 0.25 μm. The overall thickness of the first contact layer 312 can be approximately between 0.2 to 0.5 μm. An oxide layer 314 of approximately 100 nanometers (nm), 0.1 μm, thickness or less is formed on the first contact layer 312. In one embodiment, the oxide layer 314 can be formed by thermal oxide growth techniques. A second contact layer 316 of n+ silicon is formed on the oxide layer 314, using known techniques to form a polycrystalline second contact layer 316. The second contact layer 316 is formed to a thickness of 100 nm or less.

Next, a thin silicon dioxide layer (SiO$_2$) 318 of approximately 10 nm is deposited on the second contact layer 316. A thicker silicon nitride layer (Si$_3$N$_4$) 320 of approximately 100 nm in thickness is deposited on the thin silicon dioxide layer (SiO$_2$) 318 to form pad layers, e.g. layers 318 and 320. These pad layers 318 and 320 can be deposited using any suitable technique such as by chemical vapor deposition (CVD).

A photoresist is applied and selectively exposed to provide a mask for the directional etching of trenches 325, such as by reactive ion etching (RIE). The directional etching results in a plurality of column bars 330 containing the stack of nitride layer 320, pad oxide layer 318, second contact layer 316, oxide layer 314, and first contact layer 312. Trenches 325 are etched to a depth that is sufficient to reach the surface 332 of substrate 310, thereby providing separation between conductively doped bit lines 302. The photoresist is removed. Bars 330 are now oriented in the direction of bit lines 302, e.g. column direction. In one embodiment, bars 330 have a surface line width of approximately one micron or less. The width of each trench 325 can be approximately equal to the line width of bars 330. The structure is now as appears in FIG. 3A.

In FIG. 3B, isolation material 333, such as SiO$_2$ is deposited to fill the trenches 325. The working surface is then planarized, such as by chemical mechanical polishing/planarization (CMP). A second photoresist is applied and selectively exposed to provide a mask for the directional etching of trenches 335 orthogonal to the bit line 302 direction, e.g. row direction. Trenches 335 can be formed using any suitable technique such as by reactive ion etching (RIE). Trenches 335 are etched through the exposed SiO$_2$ and the exposed stack of nitride layer 320, pad oxide layer 318, second contact layer 316, oxide layer 314, and into the first contact layer 312 but only to a depth sufficient to leave the desired bit line 302 thickness, e.g. a remaining bit line thickness of typically 100 nm. The structure is now as appears in FIGS. 3B having individually defined pillars 340-1, 340-2, 340-3, and 340-4.

FIG. 3C illustrates a cross sectional view of the structure shown in FIG. 3B taken along cut-line 3C–3C. FIG. 3C shows the continuous bit line 302 connecting adjacent pillars 340-1 and 340-2 in any given column. Trench 335 remains for the subsequent formation of floating gates and control gates, as described below, in between adjacent rows of the pillars, such as a row formed by pillars 340-1 and 340-4 and a row formed by pillars 340-2, and 340-3.

Figure 4A:
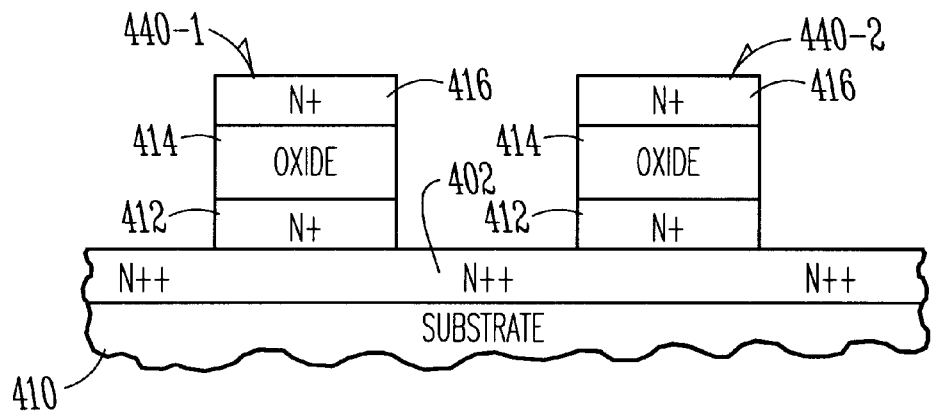
FIGS. 4A–4C illustrate that the above techniques described in connection with FIGS. 3A–3C can be implemented with a bulk CMOS technology or a silicon on insulator (SOI) technology.
Figure 4B:
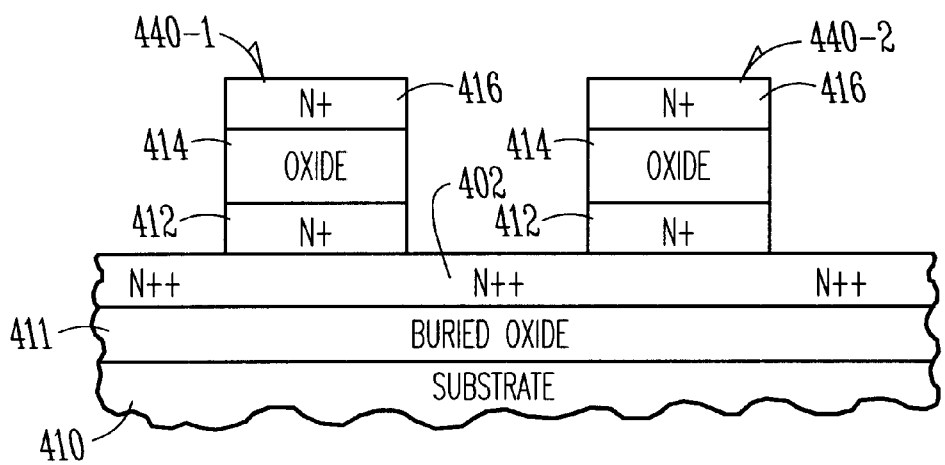
Figure 4C:
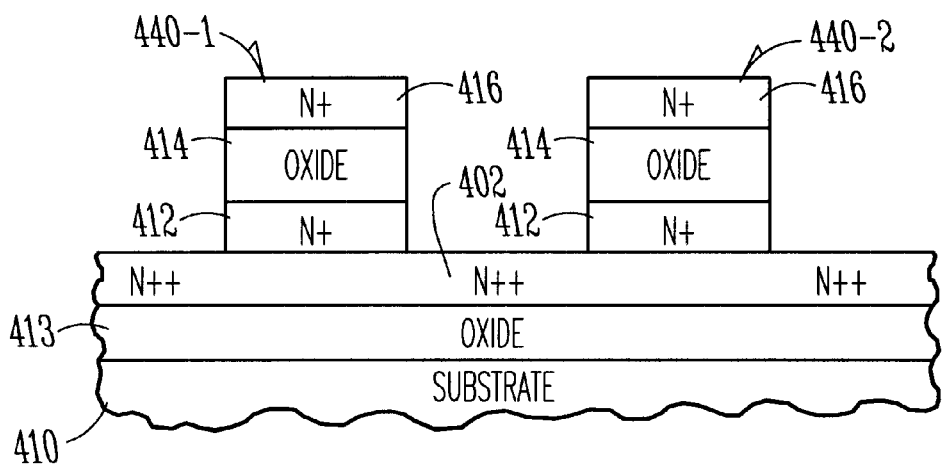

FIGS. 4A–4C illustrate that the above techniques described in connection with FIGS. 3A–3C can be implemented on a bulk CMOS technology substrate or a silicon on insulator (SOI) technology substrate. FIG. 4A represents the completed sequence of process steps shown in FIGS. 3A–3C, minus the pad layers, formed on a lightly doped p-type bulk silicon substrate 410. The structure shown in FIG. 4A is similar to the cross sectional view in FIG. 3C and shows a continuous bit line 402 with pillar stacks 440-1 and 440-2 formed thereon. The pillars 440-1 and 440-2 include an n+ first contact layer 412, an oxide layer 414 formed thereon, and a second n+ contact layer 416 formed on the oxide layer 414.

FIG. 4B represents the completed sequence of process steps shown in FIGS. 3A–3C, minus the pad layers, formed on a commercial SOI wafer, such as SIMOX. As shown in FIG. 4B, a buried oxide layer 411 is present on the surface of the substrate 410. The structure shown in FIG. 4B is also similar to the cross sectional view in FIG. 3C and shows a continuous bit line 402 with pillar stacks 440-1 and 440-2 formed thereon, only here the continuous bit line 402 is separated from the substrate 410 by the buried oxide layer 411. Again, the pillars 440-1 and 440-2 include an n+ first contact layer 412, an oxide layer 414 formed thereon, and a second n+ contact layer 416 formed on the oxide layer 414.

FIG. 4C represents the completed sequence of process steps shown in FIGS. 3A–3C, minus the pad layers, forming islands of silicon on an insulator, where the insulator 413 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 4C is also similar to the cross sectional view in FIG. 3C and shows a continuous bit line 402 with pillar stacks 440-1 and 440-2 formed thereon, only here the continuous bit line 402 is separated from the substrate 410 by the insulator 413 which has been formed by oxide under cuts such as according to the process referenced above. Again, the pillars 440-1 and 440-2 include an n+ first contact layer 412, an oxide layer 414 formed thereon, and a second n+ contact layer 416 formed on the oxide layer 414. Thus, according to the teachings of the present invention, the sequence of process steps to form pillars, as shown in FIGS. 3A–3C, can include forming the same on at least three different types of substrates as shown in FIGS. 4A–4C.

Figure 5A:
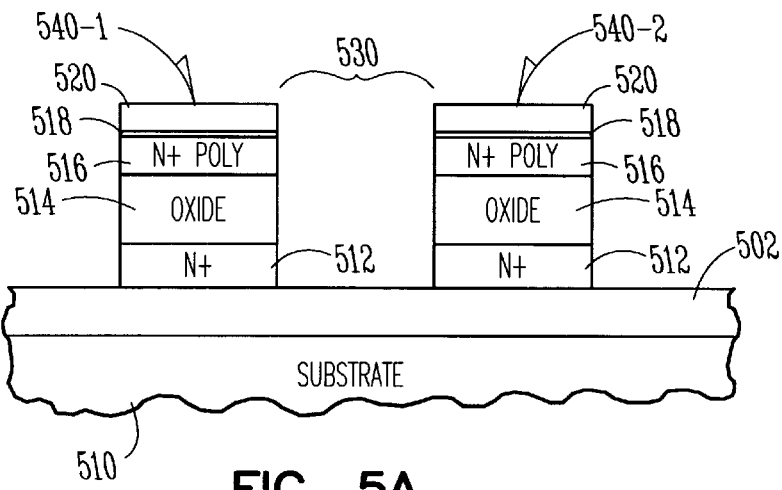
FIGS. 5A–5C illustrate a process sequence continuing from the pillar formation embodiments provided in FIGS. 3A–4C to form vertical ultra thin body transistors along side of the pillars.
Figure 5B:
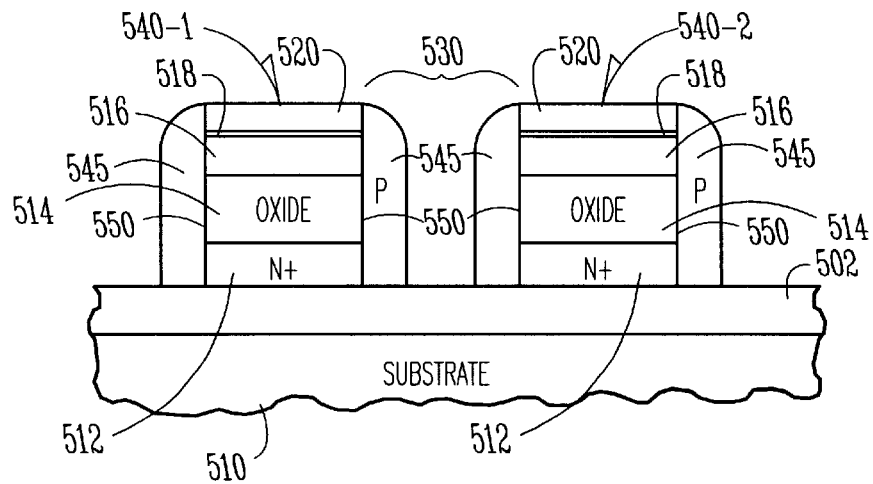
Figure 5C:
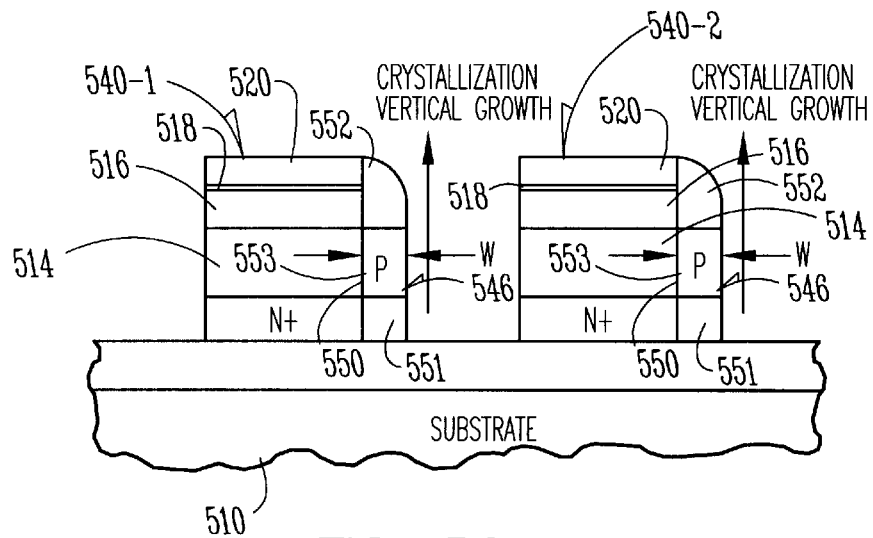

FIGS. 5A–5C illustrate a process sequence continuing from the pillar formation embodiments provided in FIGS. 3A–3C, and any of the substrates shown in FIGS. 4A–4C, to form vertical ultra thin body transistors along side of the pillars, such as pillars 340-1 and 340-2 in FIG. 3C. For purposes of illustration only, FIG. 5A illustrates an embodiment pillars 540-1 and 540-2 formed on a p-type substrate 510 and separated by a trench 530. Analogous to the description provided in connection FIGS. 3A–3C, FIG. 5A shows a first single crystalline n+ contact layer 512 a portion of which, in one embodiment, is integrally formed with an n++ bit line 502. An oxide layer region 514 is formed in pillars 540-1 and 540-2 on the first contact layer 512. A second n+ contact layer 516 is shown formed on the oxide layer region 514 in the pillars 540-1 and 540-2. And, pad layers of (SiO$_2$) 518 and (Si$_3$N$_4$) 520, respectively are shown formed on the second contact layer 516 in the pillars 540-1 and 540-2.

In FIG. 5B, a lightly doped p-type polysilicon layer 545 is deposited over the pillars 540-1 and 540-2 and directionally etched to leave the lightly doped p-type material 545 on the sidewalls 550 of the pillars 540-1 and 540-2. In one embodiment according to the teachings of the present invention, the lightly doped p-type polysilicon layer is directionally etched to leave the lightly doped p-type material 545 on the sidewalls 550 of the pillars 540-1 and 540-2 having a width (W), or horizontal thickness of 10 nm or less. The structure is now as shown in FIG. 5B.

The next sequence of process steps is described in connection with FIG. 5C. At this point another masking step, as the same has been described above, can be employed to isotropically etch the polysilicon 545 off of some of the sidewalls 550 and leave polysilicon 545 only on one sidewall of the pillars 540-1 and 540-2 if this is required by some particular configuration, e.g. forming ultra thin body transistors only on one side of pillars 540-1 and 540-2.

In FIG. 5C, the embodiment for forming the ultra thin single crystalline vertical transistors, or ultra thin body transistors, only on one side of pillars 540-1 and 540-2 is shown. In FIG. 5C, the wafer is heated at approximately 550 to 700 degrees Celsius. In this step, the polysilicon 545 will recrystallize and lateral epitaxial solid phase regrowth will occur vertically. As shown in FIG. 5C, the single crystalline silicon at the bottom of the pillars 540-1 and 540-2 will seed this crystal growth and an ultrathin single crystalline film 546 will form which can be used as the channel of an ultra thin single crystalline vertical MOSFET transistor. In the embodiment of FIG. 5C, where the film is left only on one side of the pillar, the crystallization will proceed vertically and into the n+ polysilicon second contact material/layer 516 on top of the pillars 540-1 and 540-2. If however, both sides of the pillars 540-1 and 540-2 are covered, the crystallization will leave a grain boundary near the center on top of the pillars 540-1 and 540-2.

As shown in FIG. 5C, drain and source regions, 551 and 552 respectively, will be formed in the ultrathin single crystalline film 546 along the sidewalls 550 of the pillars 540-1 and 540-2 in the annealing process by an out diffusion of the n+ doping from the first and the second contact layers, 512 and 516. In the annealing process, these portions of the ultrathin single crystalline film 546, now with the n+ dopant, will similarly recrystallize into single crystalline structure as the lateral epitaxial solid phase regrowth occurs vertically. The drain and source regions, 551 and 552, will be separated by a vertical single crystalline body region 552 formed of the p-type material. In one embodiment of the present invention, the vertical single crystalline body region will have a vertical length of less than 100 nm. The structure is now as shown in FIG. 5C. As one of ordinary skill in the art will understand upon reading this disclosure. A conventional gate insulator can be grown or deposited on this ultrathin single crystalline film 546. And, either horizontal or vertical gate structures can be formed in trenches 530.

As one of ordinary skill in the art will understand upon reading this disclosure, drain and source regions, 551 and 552 respectively, have been formed in an ultrathin single crystalline film 546 to form a portion of the ultra thin single crystalline vertical transistors, or ultra thin body transistors, according to the teachings of the present invention. The ultrathin single crystalline film 546 now includes an ultra thin single crystalline vertical first source/drain region 551 coupled to the first contact layer 512 and an ultra thin single crystalline vertical second source/drain region 552 coupled to the second contact layer 516. An ultra thin p-type single crystalline vertical body region 553 remains along side of, or opposite, the oxide layer 514 and couples the first source/drain region 551 to the second source/drain region 552. In effect, the ultra thin p-type single crystalline vertical body region 553 separates the drain and source regions, 551 and 552 respectively, and can electrically couple the drain and source regions, 551 and 552, when a channel is formed therein by an applied potential. The drain and source regions, 551 and 552 respectively, and the ultra thin body region 553 are formed of single crystalline material by the lateral solid phase epitaxial regrowth which occurs in the annealing step.

The dimensions of the structure now include an ultra thin single crystalline body region 553 having a vertical length of less than 100 nm in which a channel having a vertical length of less than 100 nm can be formed. Also, the dimensions include drain and source regions, 551 and 552 respectively, having a junction depth defined by the horizontal thickness of the ultrathin single crystalline film 546, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 530 as described in connection with the Figures below.

Figure 6A:
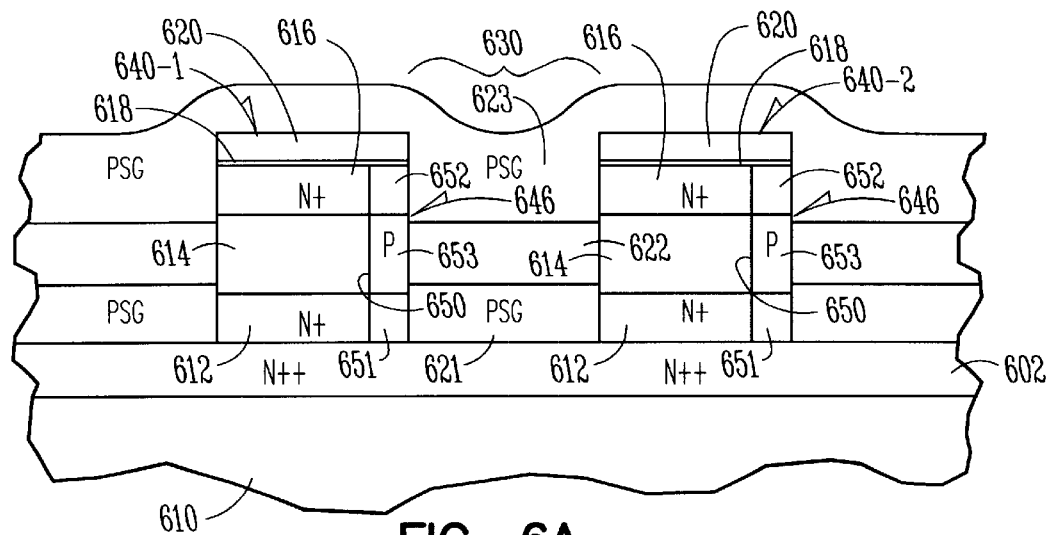
FIGS. 6A–6F illustrate a process sequence for forming a stacked horizontal floating gate and control gate structure embodiment according to the teachings of the present invention.

FIGS. 6A–6F illustrate a process sequence for forming a stacked horizontal floating gate and control gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 6A represents a structure similar to that shown in FIG. 5C. That is FIG. 6A shows an ultrathin single crystalline film 646 along the sidewalls 650 of pillars 640-1 and 640-2 in trenches 630. The ultrathin single crystalline film 646 at this point includes an ultra thin single crystalline vertical first source/drain region 651 coupled to a first contact layer 612 and an ultra thin single crystalline vertical second source/drain region 652 coupled to a second contact layer 616. An ultra thin p-type single crystalline vertical body region 653 is present along side of, or opposite, an oxide layer 614 and couples the first source/drain region 651 to the second source/drain region 652. According to the process embodiment shown in FIG. 6A an n+ doped oxide layer 621, or PSG layer as the same will be known and understood by one of ordinary skill in the art will understand, is deposited over the pillars 640-1 and 640-2 such as by a CVD technique. This n+ doped oxide layer 621 is then planarized to remove off of the top surface of the pillars 640-1 and 640-2. An etch process is performed to leave about 50 nm at the bottom of trench 630. Next, an undoped polysilicon layer 622 or undoped oxide layer 622 is deposited over the pillars 640-1 and 640-2 and CMP planarized to again remove from the top surface of the pillars 640-1 and 640-2. Then, the undoped polysilicon layer 622 is etched, such as by RIE to leave a thickness of 100 nm or less in the trench 630 along side of, or opposite oxide layer 614. Next, another n+ doped oxide layer 623, or PSG layer as the same will be known and understood by one of ordinary skill in the art will understand, is deposited over the pillars 640-1 and 640-2 such as by a CVD process. The structure is now as appears in FIG. 6A.

Figure 6B:
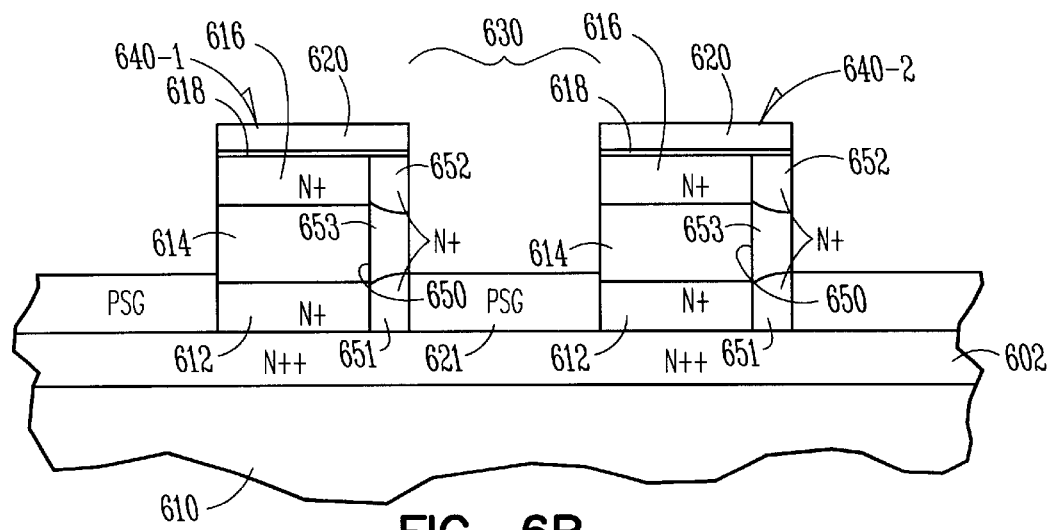

FIG. 6B illustrates the structure following the next sequence of fabrication steps. In FIG. 6B, a heat treatment is applied to diffuse the n-type dopant out of the PSG layers, e.g. 621 and 623 respectively, into the vertical ultrathin single crystalline film 646 to additionally form the drain and source regions, 651 and 652 respectively. Next, as shown in FIG. 6B, a selective etch is performed, as the same will be known and understood by one of ordinary skill in the art upon reading this disclosure, to remove the top PSG layer 623 and the undoped polysilicon layer 622, or oxide layer 622 in the trench 630. The structure is now as appears in FIG. 6B.

Figure 6C:
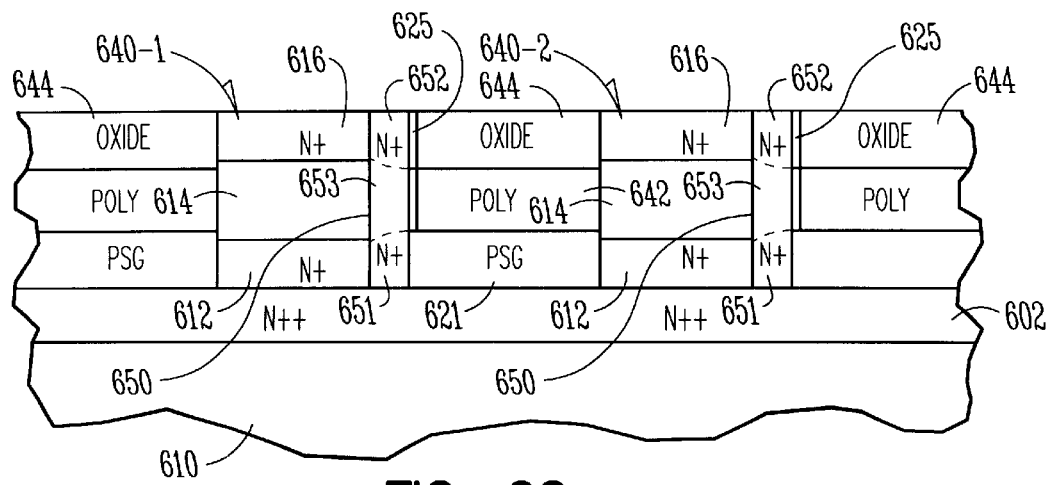

Next, in FIG. 6C, a thin gate oxide 625 is grown as the same will be known and understood by one of ordinary skill in the art, such as by thermal oxidation, for the ultra thin single crystalline vertical transistors, or ultra thin body transistors on the surface of the ultra thin single crystalline vertical body region 653. Next, doped n+ type polysilicon layer 642 can be deposited to form a gate 642 for the ultra thin single crystalline vertical transistors, or ultra thin body transistors. The structure then undergoes a CMP process to remove the doped n+ type polysilicon layer 642 from the top surface of the pillars 640-1 and 640-2 and RIE etched to form the desired thickness of the gate 642 for the ultra thin single crystalline vertical transistors, or ultra thin body transistors. In one embodiment, the doped n+ type polysilicon layer 642 is RIE etched to form an integrally formed, horizontally oriented floating gate 642 having a vertical side of less than 100 nanometers opposing the ultra thin single crystalline vertical body region 653. Next, an oxide layer 644 is deposited such as by a CVD process and planarized by a CMP process to fill trenches 630. An etch process is performed, as according to the techniques described above to strip the nitride layer 620 from the structure. This can include a phosphoric etch process using phosphoric acid. The structure is now as appears as is shown in FIG. 6C.

Figure 6D:
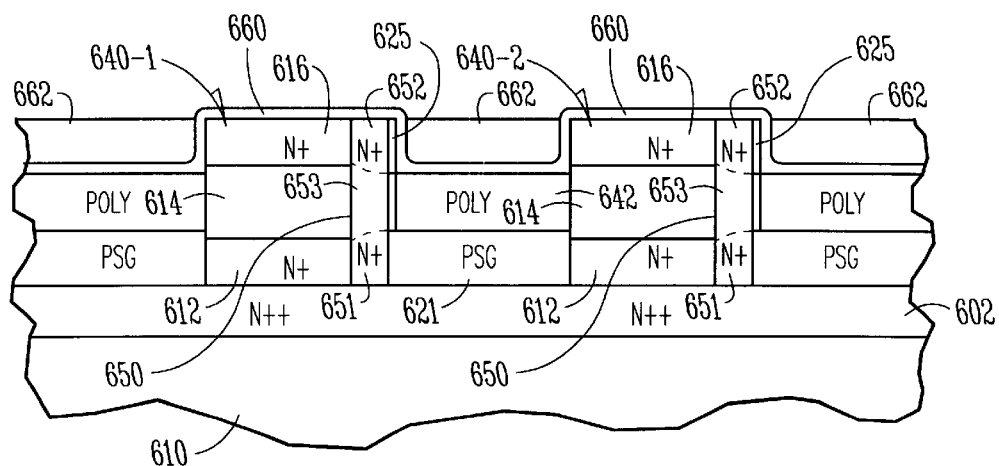

FIG. 6D illustrates the next sequence of fabrication steps. In FIG. 6D, the oxide layer 644 on the top of the horizontally oriented floating gate 642 is masked and etched, such as by RIE, to remove the oxide layer 644 in regions where the interpoly gate insulator or control gate insulator will be formed. Next, the interpoly gate insulator or control gate insulator 660 is formed. The interpoly gate insulator or control gate insulator 660 can be thermally grown oxide layer 660, or a deposited an oxynitride control gate insulator layer 660, as the same will be know and understood by one of ordinary skill in the art. The interpoly gate insulator or control gate insulator 660 is formed to a thickness of approximately 2 to 4 nanometers. Next, a polysilicon control gate 662 is formed. The polysilicon control gate can be formed by conventional photolithographic techniques for patterning and then depositing, such as by CVD, a polysilicon control gate line above the horizontally oriented floating gates 642. Another oxide layer can be deposited over the surface of the structure, such as by CVD to proceed with further fabrication steps.

Figure 6E:
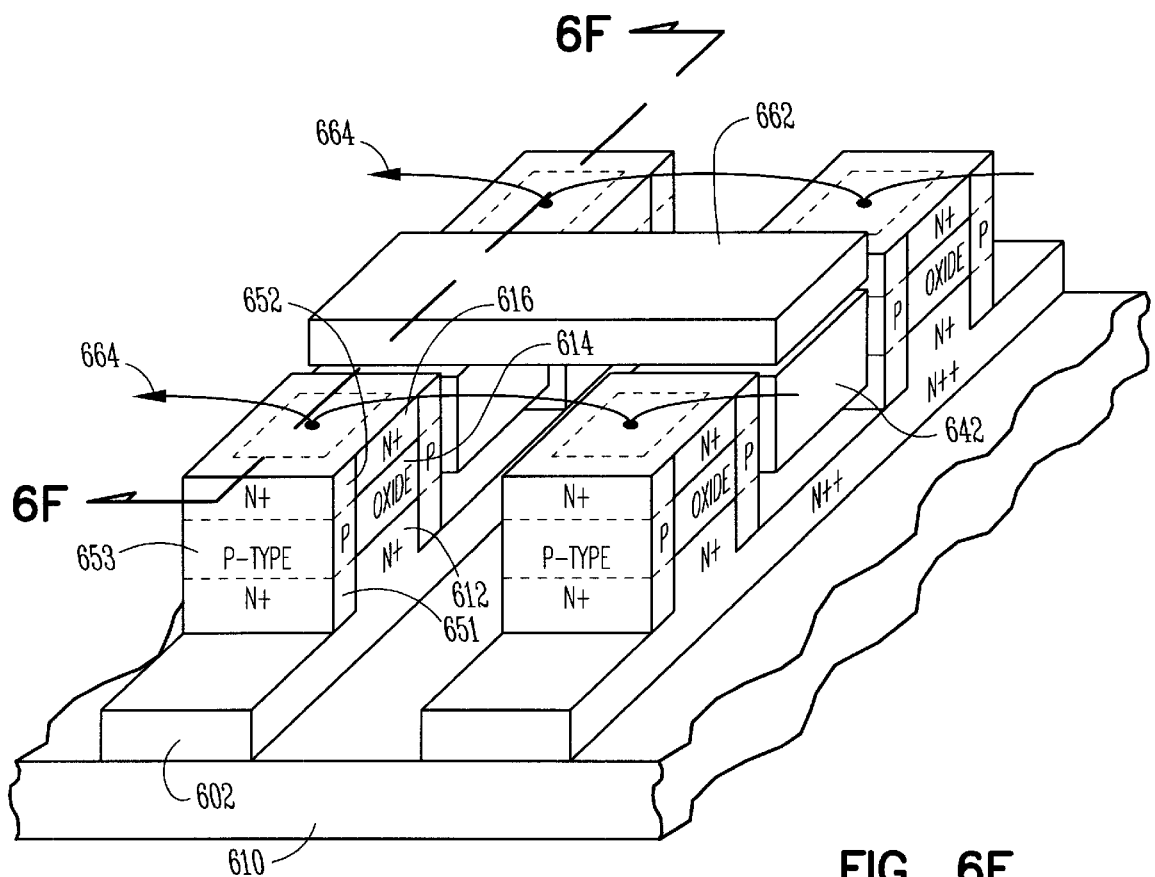
Figure 6F:
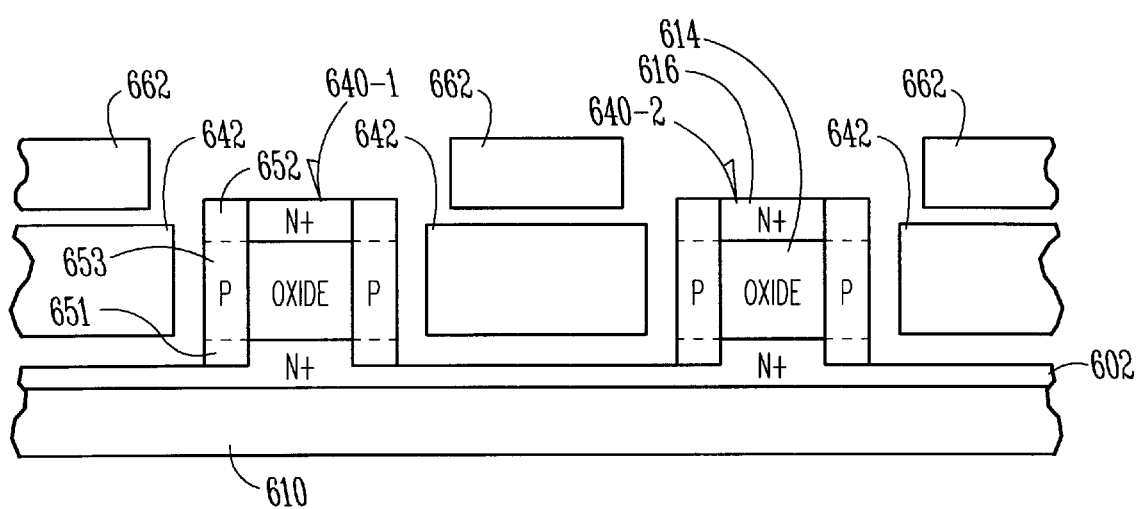

As one of ordinary skill in the art will understand upon reading this disclosure, contacts can be formed to the second contact layer 616 on top of the pillars 640-1 and 640-2 to continue with data line 664 formation and standard BEOL processes. These methods can include conventional contact hole, terminal metal and inter level insulator steps to complete wiring of the cells and peripheral circuits. FIG. 6E is a perspective view of the completed structure. And, FIG. 6F is a cross sectional view of the same taken along cut line 6F–6F.

Alternatively, the above sequence of fabrication could have been followed minus the replacement gate steps. In this alternative embodiment, the process would have again begun with a structure similar to that shown in FIG. 5C. However, in FIG. 6A a conformal nitride layer would have been deposited to approximately 10 nm and then directionally etched to leave the nitride on the sidewalls of the pillars. A thermal oxide would be grown to insulate the exposed segments of the sourcelines 602, or y-address line bars 602. The nitride would then be stripped by an isotropic etch (e.g. phosphoric acid) and a thin tunneling, floating gate oxide of approximately 1 to 2 nm would be grown on the wall of the exposed ultrathin single crystalline film 646. An n-type polysilicon layer would be deposited to fill the trenches (e.g>100 nm) and planarized (e.g. by CMP) and then recessed slightly below the level of the top of the ultrathin single crystalline film 646. The process would then simply continue with an etch process as described above to strip the nitride layer 620 from the structure. This can include a phosphoric etch process using phosphoric acid. From FIG. 6C forward the process would continue as described above to complete the structure.

Figure 7A:
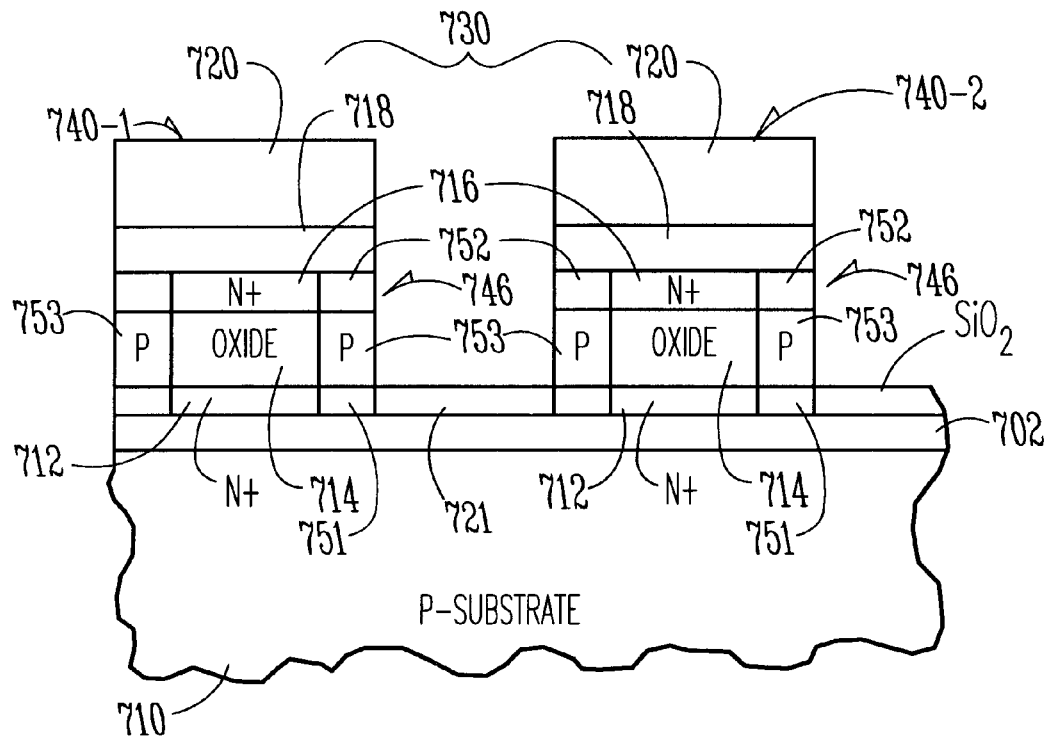
FIGS. 7A–7F illustrate a process description of one embodiment by which vertical floating gates and vertical control gates can be formed alongside vertical ultra-thin transistor body structures according to the teachings of the present invention.

FIGS. 7A–7E illustrate a process description of one embodiment by which vertical floating gates and vertical control gates can be formed alongside vertical ultrathin transistor body structures. These structures can be achieved by someone skilled in the art of integrated circuit fabrication upon reading this disclosure. The dimensions suggested in the following process steps are appropriate to a 0.1 $\mu$m CD technology and may be scaled accordingly for other CD sizes. FIG. 7A represents a structure similar to that shown in FIG. 5C. That is FIG. 7A shows an ultrathin single crystalline film 746 along the sidewalls of pillars 740-1 and 740-2 in trenches 730. The ultrathin single crystalline film 746 at this point includes an ultra thin single crystalline vertical first source/drain region 751 coupled to a first contact layer 712 and an ultra thin single crystalline vertical second source/drain region 752 coupled to a second contact layer 716. An ultra thin p-type single crystalline vertical body region 753 is present along side of, or opposite, an oxide layer 714 and couples the first source/drain region 751 to the second source/drain region 752. According to the process embodiment shown in FIG. 7A, a conformal nitride layer of approximately 10 nm is deposited, such as by CVD, and directionally etched to leave only on the sidewalls of the pillars 740-1 and 740-2. A oxide layer 721 is then grown, such as by thermal oxidation, to a thickness of approximately 20 nm in order to insulate the exposed bit line bars 702. The conformal nitride layer on the sidewalls of the pillars 740-1 and 740-2 prevents oxidation along the ultrathin single crystalline film 746. The nitride layer is then stripped, using conventional stripping processes as the same will be known and understood by one of ordinary skill in the art. The structure is now as appears in FIG. 7A.

Figure 7B:
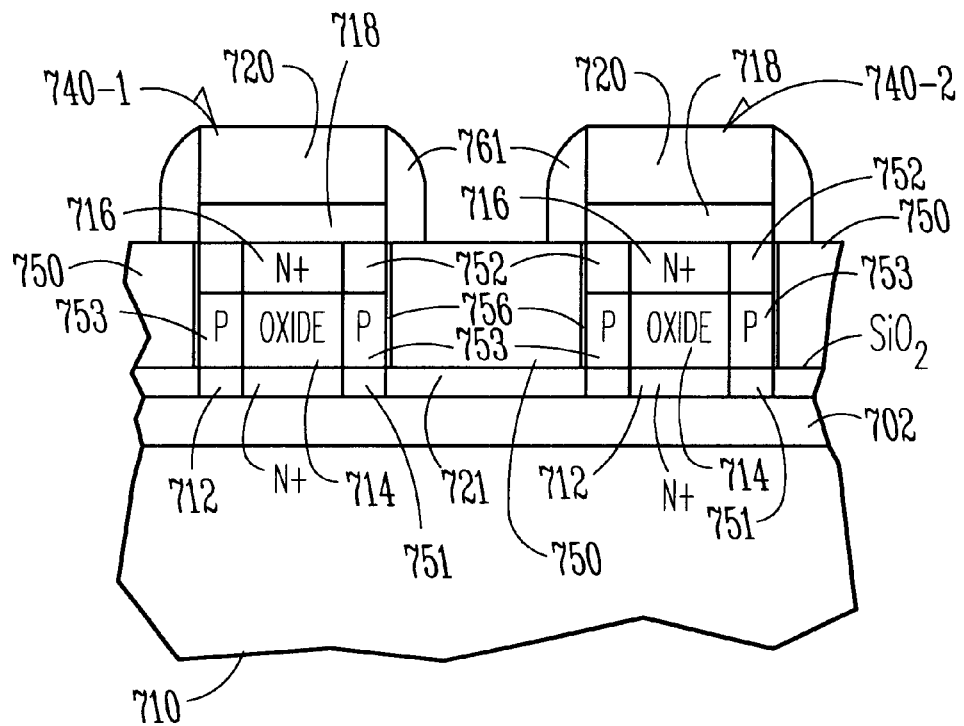

As shown in FIG. 7B, a thin tunneling oxide 756 is thermally grown on the sidewalls of the exposed ultrathin single crystalline film 746. The thin tunneling oxide 756 is grown to a thickness of approximately 1 to 2 nm. An n+ doped polysilicon material or suitable metal 750 is deposited, such as by CVD, to fill the trenches to a thickness of approximately 40 nm or less. The n+ doped polysilicon material 750 is then planarized, such as by CMP, and recessed, such as by RIE, to a height slightly below a top level of the ultrathin single crystalline film 746. A nitride layer 761 is then deposited, such as by CVD, to a thickness of approximately 20 nm for spacer formation and directionally etched to leave on the sidewalls of the thick oxide and nitride pad layers, 718 and 720 respectively. The structure is now as shown in FIG. 7B.

Figure 7C:
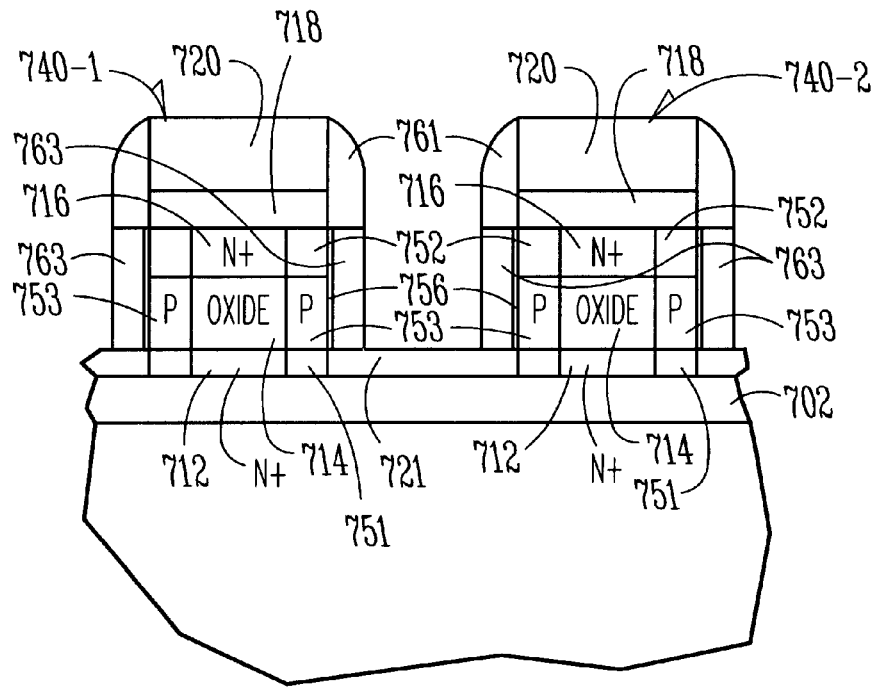

FIG. 7C illustrates the structure following the next sequence of processing steps. In FIG. 7C, the nitride spacers 761 are used as a mask and the exposed oxide in between columns of pillars, e.g. oxide 333 in FIG. 3B, is selectively etched between the sourcelines 702 to a depth approximately level with the oxide 721 on the sourcelines/y-address lines 702. Next, again using the nitride spacers 761 as a mask, the exposed n+ doped polysilicon material 750 is selectively etched stopping on the oxide layer 721 on the sourcelines/y-address lines 702 thus creating a pair of vertically oriented floating gates 763 in trench 730. The structure is now as appears in FIG. 7C.

Figure 7D:
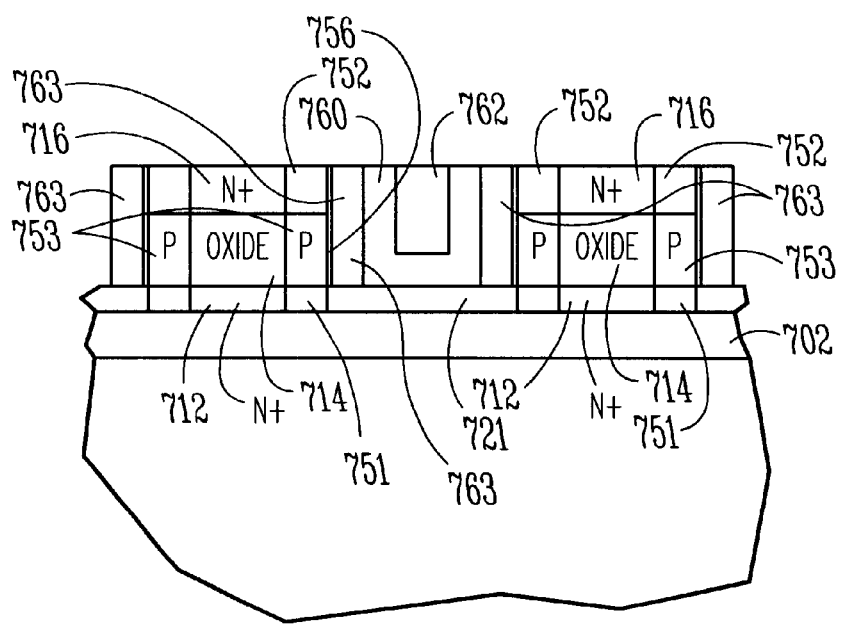

FIG. 7D illustrates the next sequence in this embodiment of the fabrication process. In FIG. 7D, the interpoly gate insulator or control gate insulator 760 is formed in the trench 730 covering the vertically oriented floating gates 763. The interpoly gate insulator or control gate insulator 760 can be thermally grown oxide layer 760, or a deposited an oxynitride control gate insulator layer 760, as the same will be know and understood by one of ordinary skill in the art. The interpoly gate insulator or control gate insulator 760 is formed to a thickness of approximately 7 to 15 nanometers. An n+ doped polysilicon material or suitable gate material 762 is deposited, such as by CVD, to fill the trenches, or gate through troughs 730 to a thickness of approximately 100 nm. The n+ doped polysilicon material 762 is then planarized, such as by CMP, stopping on the thick nitride pad layer 720. The n+ doped polysilicon material 762 is then recessed, such as by RIE, to the approximately a top level of the ultrathin single crystalline film 746. Next, the nitride pad layer 720 is removed from the pillars 740-1 and 740-2. The nitride pad layer can be removed using a phosphoric etch or other suitable techniques. An oxide 775 is then deposited over the structure, such as by CVD, to cover the surface. The structure is now as appears in FIG. 7D.

Figure 7E:
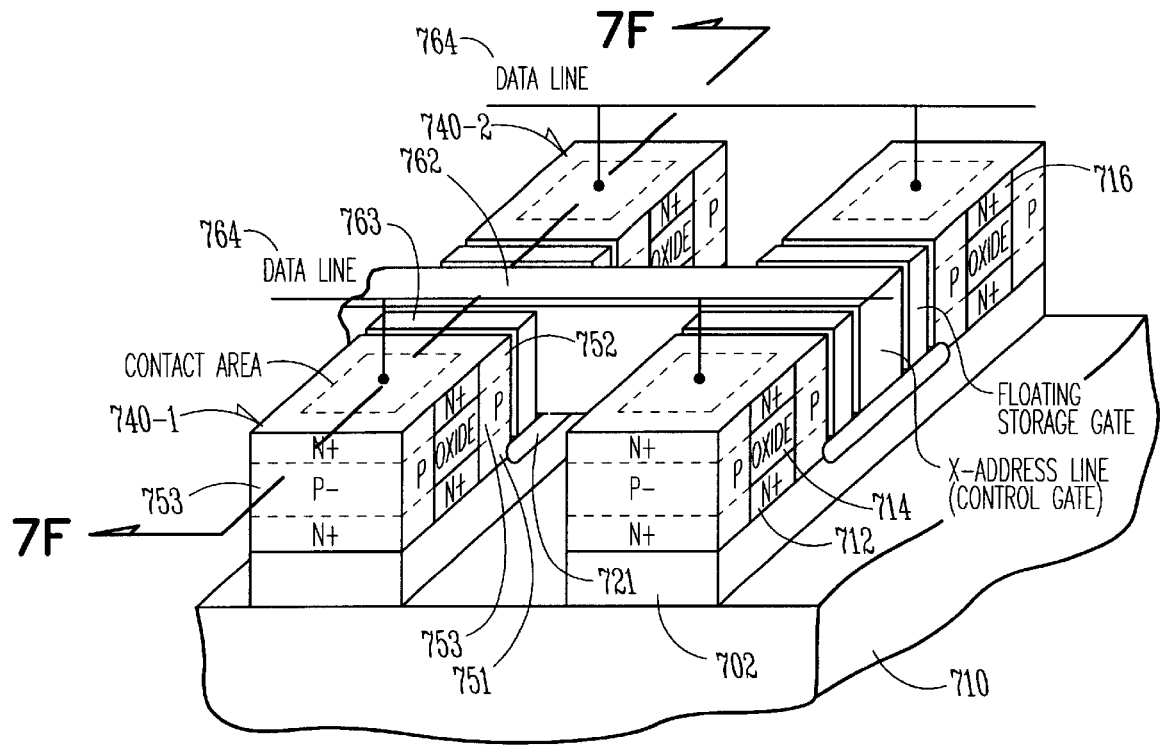
Figure 7F:
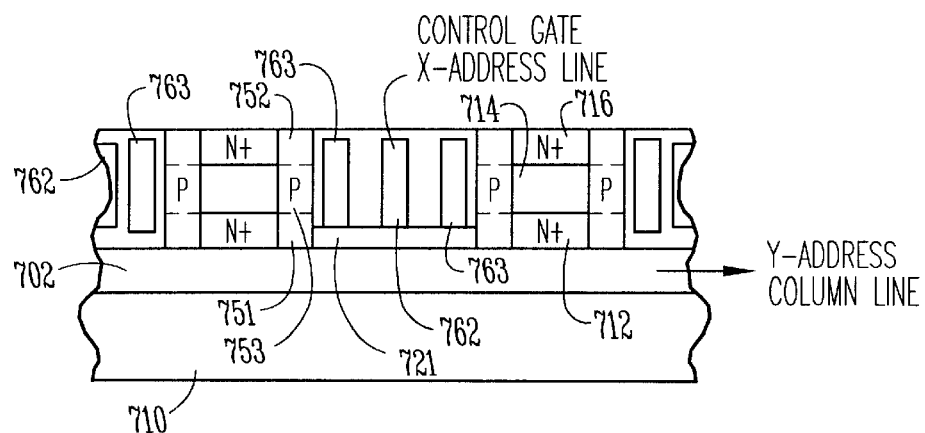

As one of ordinary skill in the art will understand upon reading this disclosure, contacts can be formed to the second contact layer 716 on top of the pillars 740-1 and 740-2 to continue with dataline 764 formation and standard BEOL processes. These methods can include conventional contact hole, terminal metal and inter level insulator steps to complete wiring of the cells and peripheral circuits. FIG. 7E is a perspective view of the completed structure. And, FIG. 7F is a cross sectional view of the same taken along cut line 7F–7F.

Figure 8A:
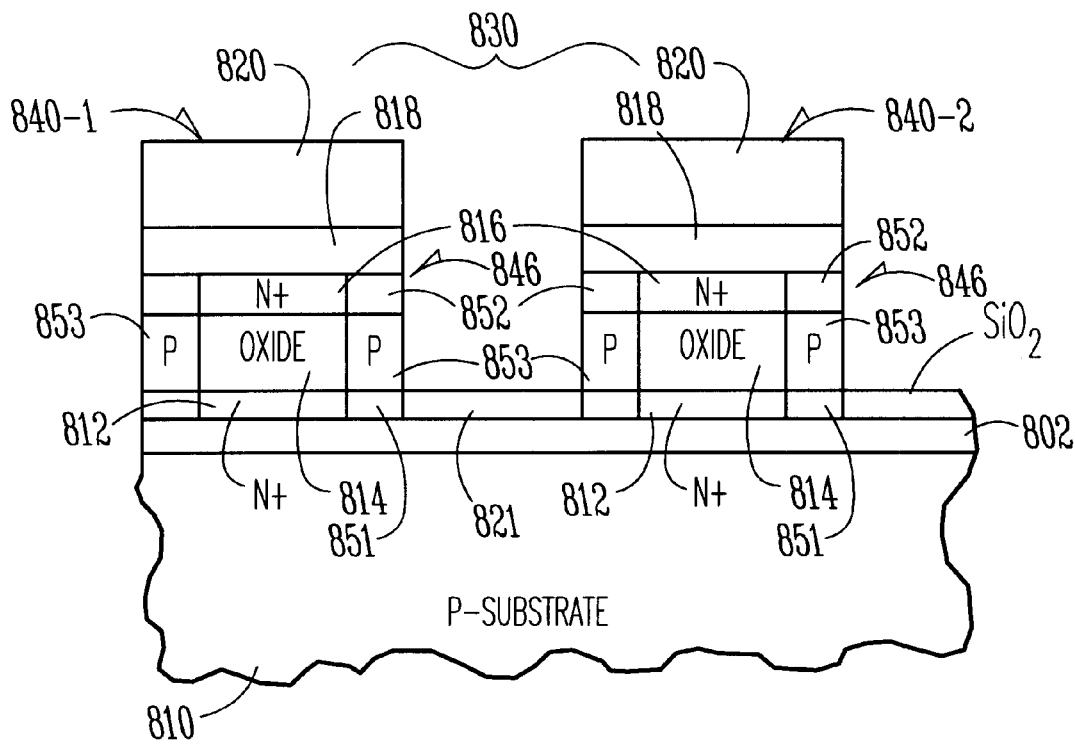
FIGS. 8A–8E illustrate a process description of one embodiment by which vertical floating gates can be formed alongside vertical ultra-thin transistor body structures and a horizontal oriented control gate can be formed above the vertically oriented floating gates according to the teachings of the present invention.

FIGS. 8A–8E illustrate a process description of one embodiment by which vertical floating gates can be formed alongside vertical ultra-thin transistor body structures and a horizontal oriented control gate can be formed above the vertically oriented floating gates. These structures can be achieved by someone skilled in the art of integrated circuit fabrication upon reading this disclosure. The dimensions suggested in the following process steps are appropriate to a 0.1 μm CD technology and may be scaled accordingly for other CD sizes. FIG. 8A represents a structure similar to that shown in FIG. 5C. That is FIG. 8A shows an ultrathin single crystalline film 846 along the sidewalls of pillars 840-1 and 840-2 in trenches 830. The ultrathin single crystalline film 846 at this point includes an ultra thin single crystalline vertical first source/drain region 851 coupled to a first contact layer 812 and an ultra thin single crystalline vertical second source/drain region 852 coupled to a second contact layer 816. An ultra thin p-type single crystalline vertical body region 853 is present along side of, or opposite, an oxide layer 814 and couples the first source/drain region 851 to the second source/drain region 852. According to the process embodiment shown in FIG. 8A, a conformal nitride layer of approximately 10 nm is deposited, such as by CVD, and directionally etched to leave only on the sidewalls of the pillars 840-1 and 840-2. A oxide layer 821 is then grown, such as by thermal oxidation, to a thickness of approximately 20 nm in order to insulate the exposed bit line bars 802. The conformal nitride layer on the sidewalls of the pillars 840-1 and 840-2 prevents oxidation along the ultrathin single crystalline film 846. The nitride layer is then stripped, using conventional stripping processes as the same will be known and understood by one of ordinary skill in the art. The structure is now as appears in FIG. 8A.

Figure 8B:
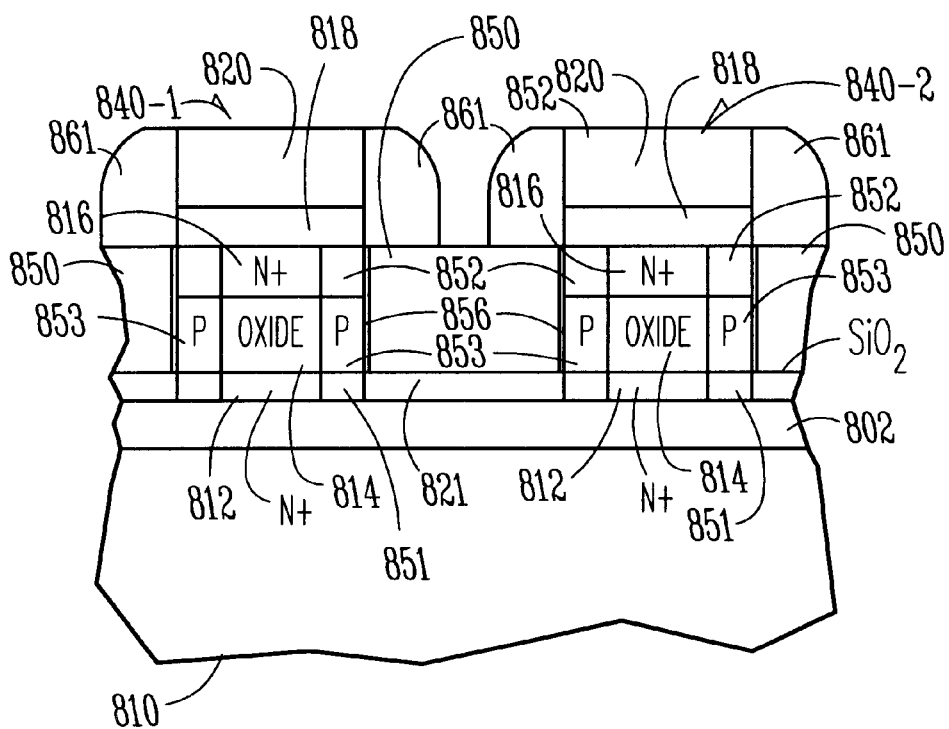

As shown in FIG. 8B, a thin tunneling oxide 856 is thermally grown on the sidewalls of the exposed ultrathin single crystalline film 846. The thin tunneling oxide 856 is grown to a thickness of approximately 1 to 2 nm. An n+ doped polysilicon material or suitable metal 850 is deposited, such as by CVD, to fill the trench to a thickness of approximately 40 nm or less. The n+ doped polysilicon material 850 is then planarized, such as by CMP, and recessed, such as by RIE, to a height slightly below a top level of the ultrathin single crystalline film 846. A nitride layer 861 is then deposited, such as by CVD, to a thickness of approximately 50 nm for spacer formation and directionally etched to leave on the sidewalls of the thick oxide and nitride pad layers, 818 and 820 respectively. The structure is now as shown in FIG. 8B.

Figure 8C:
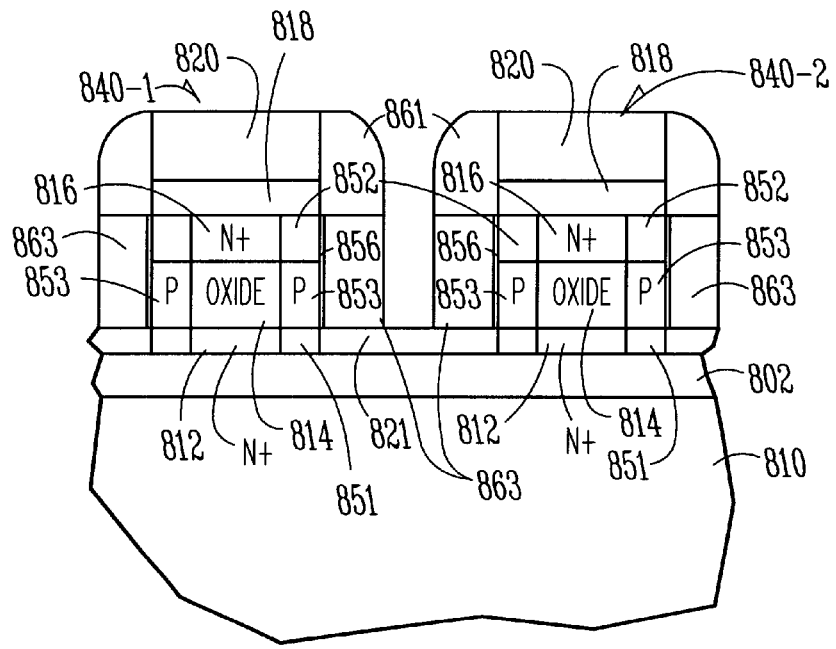

FIG. 8C illustrates the structure following the next sequence of processing steps. In FIG. 8C, the nitride spacers 861 are used as a mask and the exposed oxide in between columns of pillars, e.g. oxide 333 in FIG. 3B, is selectively etched between the sourcelines 802 to a depth approximately level with the oxide 821 on the sourcelines/y-address lines 802. Next, again using the nitride spacers 861 as a mask, the exposed n+ doped polysilicon material 850 is selectively etched stopping on the oxide layer 821 on the sourcelines/y-address lines 802 thus creating a pair of vertically oriented floating gates 863 in trench 830. The structure is now as appears in FIG. 8C.

Figure 8D:
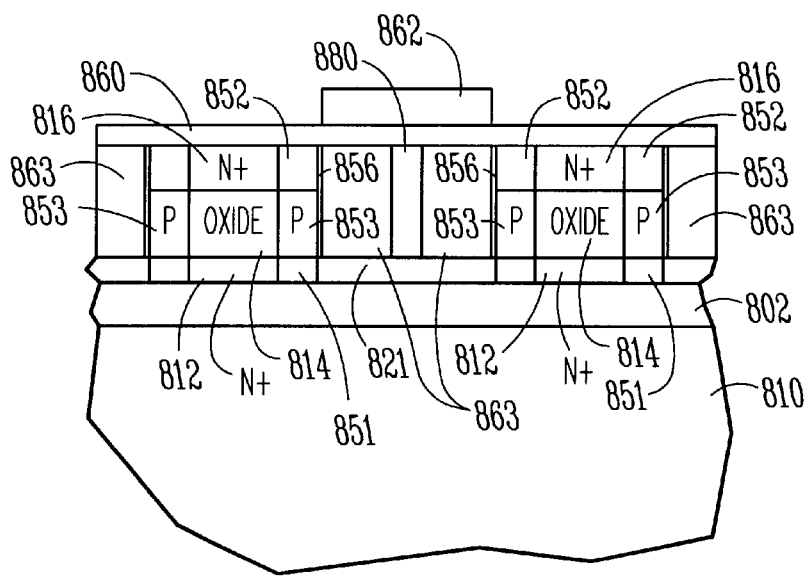

FIG. 8D illustrates the next sequence in this embodiment of the fabrication process. In FIG. 8D, an oxide layer 880 is deposited in the trench 830 covering the vertically oriented floating gates 863. The oxide layer 880 is planarized, such as by CMP, stopping on the thick nitride pad layer 820. The oxide layer 880 is then recessed, such as by RIE, to the approximately a top level of the ultrathin single crystalline film 846. Next, the nitride pad layer 820 is removed from the pillars 840-1 and 840-2 and the nitride spacers 861 are also removed. The nitride pad layer 820 and nitride spacers 861 can be removed using a phosphoric etch or other suitable techniques. An interpoly gate insulator or control gate insulator 860 is formed over the oxide layer 880 in the trench 830 and over the vertically oriented floating gates 863. The interpoly gate insulator or control gate insulator 860 can be thermally grown oxide layer 860, or a deposited an oxynitride control gate insulator layer 860, as the same will be know and understood by one of ordinary skill in the art. The interpoly gate insulator or control gate insulator 860 is formed to a thickness of approximately 2 to 4 nanometers on the vertically oriented floating gates 863. An n+ doped polysilicon material or suitable gate material 862 is deposited, such as by CVD, over the interpoly gate insulator or control gate insulator 860 and above the vertically oriented floating gates 863 to a thickness of approximately 50 nm. The n+ doped polysilicon material 862 is then patterned, as the same will be know and understood by one of ordinary skill in the art, into horizontal bars or control gate lines. An oxide 875 is can then deposited, such as by CVD to cover the surface. The structure is now as appears in FIG. 8D.

Figure 8E:
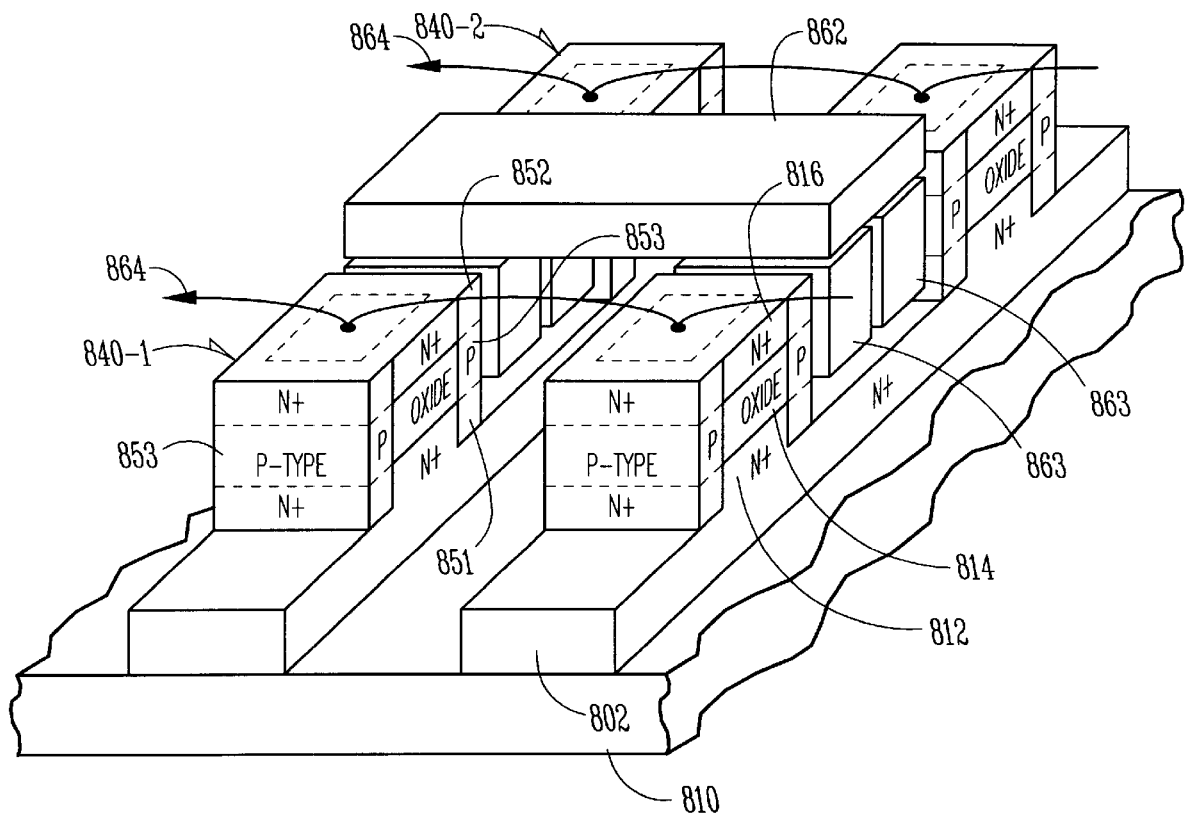

As one of ordinary skill in the art will understand upon reading this disclosure, contacts can be formed to the second contact layer 816 on top of the pillars 840-1 and 840-2 to continue with dataline 864 formation and standard BEOL processes. These methods can include conventional contact hole, terminal metal and inter level insulator steps to complete wiring of the cells and peripheral circuits. FIG. 8E is a perspective view of the completed structure.

Figure 9:
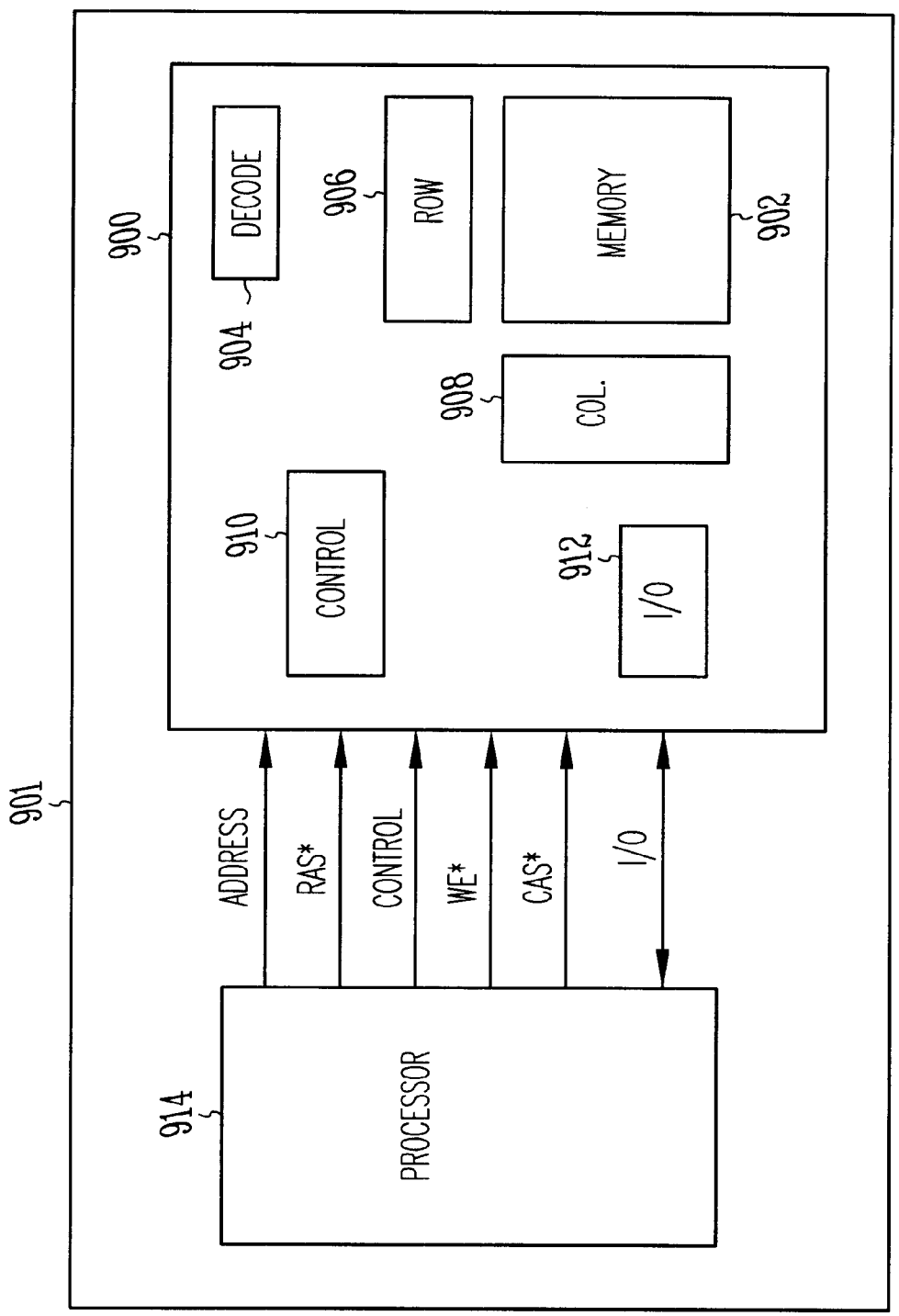
FIG. 9 illustrates a block diagram of an embodiment of an electronic system including a novel memory cell formed according to the teachings of the present invention.

FIG. 9 illustrates a block diagram of an embodiment of an electronic system 901 according to the teachings of the present invention. In the embodiment shown in FIG. 9, the system 901 includes a memory device 900 which has an array of memory cells 902, address decoder 904, row access circuitry 906, column access circuitry 908, control circuitry 910, and input/output circuit 912. Also, as shown in FIG. 9, the circuit 901 includes a processor 914, or memory controller for memory accessing. The memory device 900 receives control signals from the processor 914, such as WE*, RAS* and CAS* signals over wiring or metallization lines. The memory device 900 is used to store data which is accessed via I/O lines. It will be appreciated by those skilled in the art that additional circuitry and control signals can be provided, and that the memory device 900 has been simplified to help focus on the invention. At least one of the memory cells 902 has a memory cell formed according to the embodiments of the present invention.

It will be understood that the embodiment shown in FIG. 9 illustrates an embodiment for electronic system circuitry in which the novel memory cells of the present invention. The illustration of system 901, as shown in FIG. 9, is intended to provide a general understanding of one application for the structure and circuitry of the present invention, and is not intended to serve as a complete description of all the elements and features of an electronic system using the novel memory cell structures. Further, the invention is equally applicable to any size and type of memory device 901 using the novel memory cells of the present invention and is not intended to be limited to the described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 10:
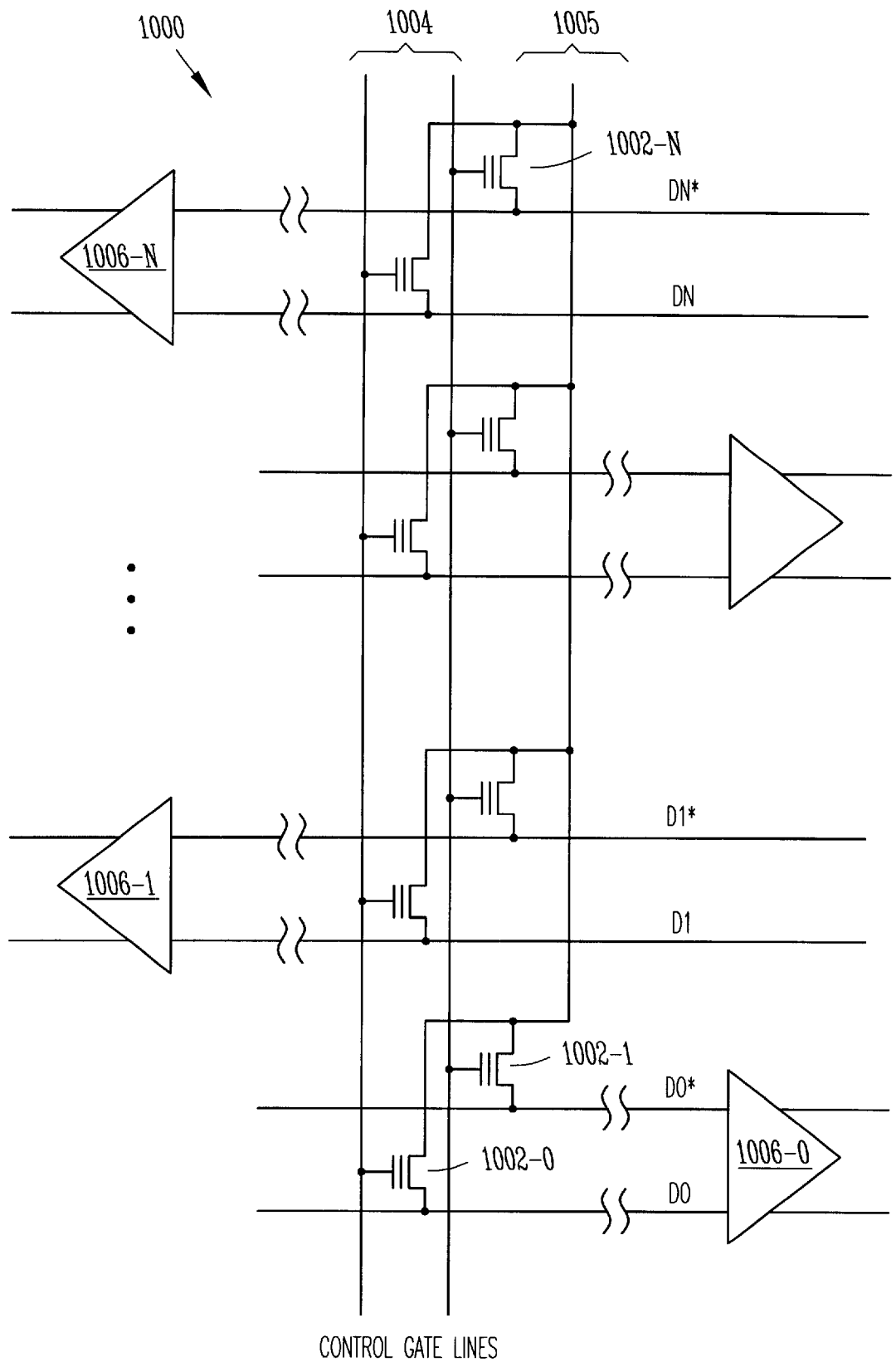
FIG. 10 illustrates an embodiment of a memory array including a novel memory cell formed according to the teachings of the present invention, as can be included in a memory device, e.g. on a memory chip/die.

FIG. 10 illustrates an embodiment of a memory array 1000, according to the teachings of the present invention, as can be included in a memory device, e.g. on a memory chip/die. The memory array shown in FIG. 10 includes a plurality of memory cells, 1002-0, 1002-1, . . . , 1002-N. The plurality of memory cells, 1002-0, 1002-1, . . . , 1002-N, includes at least one novel memory cell formed according to the teachings of the present invention. As shown in FIG. 10, the plurality of memory cells are coupled to a plurality, or number of sense amplifiers 1006-0, 1006-1, . . . , 1006-N via a number of bit lines, or digitlines, D0*, D0, D1*, D1, . . . , DN*. FIG. 10 is illustrative of the manner in which the novel memory cell of the present invention can be used in a folded bit line configuration, in substitution for a conventional folded bit line memory array. One of ordinary skill in the art will understand upon reading this disclosure, that the novel memory cells of the present invention can further be used in an open bit line configuration or any other digitline twist scheme. The invention is not so limited.

The absence of presence of stored charge on the floating gates is read by addressing the word line or control gate lines and y-column/sourcelines to form a coincidence in address at a particular floating gate. The control gate line would for instance be driven positive at some voltage of 1.0 Volts and the y-column/sourceline grounded, if the floating gate is not charged with electrons then the vertical sidewall transistor would turn on tending to hold the bit or data line on that particular row down indicating the presence of a stored "one" in the cell. If this particular floating gate is charged with stored electrons, the transistor will not turn on and the presence of a stored "zero" indicated in the cell. In this manner, data stored on a particular floating gate can be read. In reality, data is most conveniently read out in "bit pairs" by addressing not only a single data line but rather both of the data lines on each side of a particular control gate address line. Data is stored into the cell by hot electron injection, the data line is driven with a higher drain voltage like 2 Volts for 0.1 micron technology and the control gate line is addressed by some nominal voltage in the range of twice this value. Hot electrons generated in the transistor channel will be injected through the gate or tunnel oxide on to the floating gate of the transistor selected by the address scheme. Erasure is accomplished by driving the control gate line with a negative voltage and the sourceline of the transistor with a positive bias so the total voltage difference is in the order of 3 Volts causing electrons to tunnel off of the floating gates. Data will be erased in "bit pairs" since both floating gates on each side of a control gate will be erased at the same time; this architecture is amenable to block address schemes where sections of the array are erased and reset at the same time.

CONCLUSION

The above structures and fabrication methods have been described, by way of example, and not by way of limitation, with respect to flash memory with ultra thin body transistors. Different types of gate structures are shown which can be utilized on three different types of substrates to form flash memory arrays.

It has been shown that higher and higher density requirements in memories result in smaller and smaller dimensions of the structures and transistors. Conventional planar transistor structures are difficult to scale to the deep sub-micron dimensional regime. The present invention provides vertical access or transfer transistor devices which are fabricated in ultra-thin single crystalline silicon films grown along the sidewall of an oxide pillar. These transistors with ultra-thin body regions scale naturally to smaller and smaller dimensions while preserving the performance advantage of smaller devices. The advantages of smaller dimensions for higher density and higher performance are both achieved in flash memory arrays.

This invention disclosure describes a flash memory cell where the area associated with a single data bit is less than the area associated with one minimum dimension transistor and borders used in the fabrication of the memory cell. This is accomplished by (i) having vertical transistors, (ii) more than one transistor or storage element in each cell and (iii) buried lines addressing the cell which have dimensions less than the minimum feature size.

Cell structures used up to and through the 256 Mbit generation for DRAMs or flash memories have been limited to at least 8F squared sizes where "F" is the minimum feature size. This has been determined mostly by the planar structure of the source, gate, and drain on the surface of the semiconducting substrate. The cells described here by virtue of having vertical transistor structures and buried control gate or word address lines minimizes the cell surface area. The ultra-thin vertical body structures allow transistor operation with dimensions less than 100 nm further increasing density. The memory cells are basically of minimum possible dimensions, namely, 4F squared sizes, however, since each transistor can store two bits of information the bit density is one bit for each 2F squared area. The memory density for information storage is then greater than 5 Gbit/square centimeter.

What is claimed is:

1. A transistor comprising:
   a pillar extending outwardly from a substrate, wherein the pillar includes a first contact layer and a second contact layer vertically separated by an oxide layer;
   a vertical transistor formed alongside the pillar, wherein the vertical transistor includes a vertical body region separating a vertical first source/drain region and a vertical second source/drain region;
   a floating gate opposing the vertical body region; and
   a control gate separated from the floating gate by an insulator layer.

2. The transistor of claim 1, wherein the vertical body region includes a channel having a vertical length of less than 100 nanometers.

3. The transistor of claim 1, wherein the vertical body region has a horizontal width of less than 10 nanometers.

4. The transistor of claim 1, wherein the vertical body region is formed from solid phase epitaxial growth.

5. A memory cell comprising:
   a pillar extending outwardly from a substrate, wherein the pillar includes a first contact layer and a second contact layer separated by an oxide layer;
   a vertical transistor formed alongside the pillar, wherein the vertical transistor includes:
      a vertical first source/drain region coupled to the first contact layer;
      a vertical second source/drain region coupled to the second contact layer;
      a vertical body region formed alongside the oxide layer, wherein the vertical body region couples the first source/drain region to the second source/drain region; and
      a floating gate opposing the vertical body region and separated therefore by a gate oxide;
   a control gate separated from the floating gate by an insulator layer;
   a buried bit line formed of material and disposed below the vertical body region, wherein the buried bit line is coupled to the first contact layer; and
   a data line coupled to the second contact layer.

6. The memory cell of claim 5, wherein the buried bit line is more heavily doped than the first contact layer and is formed integrally with the first contact layer.

7. The memory cell of claim 5, wherein the vertical body region includes a p-type channel having a vertical length of less than 100 nanometers.

8. The memory cell of claim 7, wherein the vertical body region has a horizontal width of less than 10 nanometers.

9. The memory cell of claim 5, wherein the pillar extends outwardly from an insulating portion of the substrate.

10. The memory cell of claim 5, wherein the substrate includes a silicon on insulator substrate.

11. A memory cell comprising:
    a pillar extending outwardly from a substrate, wherein the pillar includes a first contact layer and a second contact layer separated by an oxide layer;
    a vertical transistor formed alongside the pillar, wherein the vertical transistor includes:
       a vertical first source/drain region coupled to the first contact layer;
       a vertical second source/drain region coupled to the second contact layer;
       a vertical body region formed alongside the oxide layer, wherein the vertical body region couples the vertical first source/drain region to the vertical second source/drain region; and
       a floating gate opposing the vertical body region and separated therefrom by a gate oxide;
    a control gate separated from the floating gate by an insulator layer;
    a buried bit line formed of material and disposed below the vertical body region, wherein the buried bit line is coupled to the first contact layer;
    a data line coupled to the second contact layer; and
    wherein the floating gate is formed in a trench below a top surface of the pillar for addressing the vertical body region.

12. The memory cell of claim 11, wherein the control gate is formed in the trench below the top surface of the pillar.

13. The memory cell of claim 11, wherein the floating gate includes a horizontally oriented floating gate, wherein a vertical side of the horizontally oriented floating gate has a length of less than 100 nanometers.

14. The memory cell of claim 11, wherein the floating gate includes a vertically oriented floating gate having a vertical length of less than 100 nanometers.

15. A memory cell comprising:
    a pillar extending outwardly from a substrate, wherein the pillar includes a first contact layer and a second contact layer separated by an oxide layer;
    a pair of vertical transistor formed along opposing sides of the pillar, wherein each vertical transistor of the pair of vertical transistors includes;
       a vertical first source/drain region coupled to the first contact layer;
       a vertical second source/drain region coupled to the second contact layer;
       a vertical body region formed alongside the oxide layer, wherein the vertical body region couples the vertical first source/drain region to the vertical second source/drain region;
       a floating gate opposing the vertical body region and separated therefrom by a gate oxide;
       wherein a horizontal junction depth for the vertical first and the second source/drain regions is much less than a vertical length of the vertical body region;
    a control gate separated from the floating gate by an insulator layer; and
    a buried bit line formed of material and disposed below the vertical body regions, wherein the buried bit line is coupled to the first contact layer; and a data line coupled to the second contact layer.

16. The memory cell of claim 15, wherein the floating gate is independently disposed in a pair of trenches on opposing sides of the pillar such that the floating gate is below a top surface of the pillar.

17. The memory cell of claim 16, wherein the control gate is formed in the trench below the top surface of the pillar.

18. The memory cell of claim 15, wherein the vertical body region includes a p-type channel having a vertical length of less than 100 nanometers.

19. The memory cell of claim 15, wherein the buried bit line is formed integrally with the first contact layer and is separate from the substrate by an oxide layer.

20. The memory cell of claim 15, wherein the floating gate includes a horizontally oriented floating gate having a vertical side length of less than 100 nanometers.

21. The memory cell of claim 15, wherein the floating gate includes a vertically oriented floating gate having a vertical length of less than 100 nanometers.

22. An array of memory cells comprising:
- a number of pillars extending outwardly from a substrate, wherein each of the pillars includes a first contact layer and a second contact layer separated by an oxide layer;
- a number of vertical transistors formed along selected sides of the pillars, wherein each of the vertical transistors includes;
    - a vertical first source/drain region coupled to the first contact layer;
    - a vertical second source/drain region coupled to the second contact layer;
    - a vertical body region opposing the oxide layer and coupling the vertical first and second source/drain regions; and
    - a floating gate opposing the vertical body region and separated therefrom by a gate oxide;
- a plurality of buried bit lines formed of material and disposed below the pillars in the array memory cells for interconnecting with the first contact layer of column adjacent pillars in the array of memory cells; and
- a plurality of control lines separated from the floating gate by an insulator layer.

23. The array of memory cell of claim 22, wherein the floating gate is formed in a trench below a top surface of each of the pillars.

24. The array of memory cell of claim 23, wherein the floating gate includes a horizontally oriented floating gate having a vertical side of less than 100 nanometers, and wherein the horizontally oriented floating gate are separated by a floating gate oxide from the vertical body regions on opposing sides of the trench for column adjacent pillars.

25. The array of memory cells of claim 24, wherein the plurality of control lines are disposed vertically above the floating gates.

26. The array of memory cells of claim 22, wherein the vertical body region includes a p-type channel having a vertical length of less than 100 nanometers.

27. The array of memory cells of claim 22, wherein each of the plurality of buried bit lines is separated by an oxide layer from the substrate.

28. The array of memory cells of claim 22, wherein the floating gate includes a vertically oriented floating gate having a vertical length of less than 100 nanometers.

29. An array of memory cells comprising:
- a number of pillars extending outwardly from a substrate, wherein each of the pillars includes a first contact layer and a second contact layer separated by an oxide layer;
- a pair of vertical transistors formed along opposing sides of each of the pillars, wherein each vertical transistor of pair of vertical transistors includes;
    - a vertical first source/drain region coupled to the first contact layer;
    - a vertical second source/drain region coupled to the second contact layer;
    - a vertical body region formed alongside the oxide layer and coupling the vertical first and second source/drain regions; and
    - a floating gate opposing the vertical body region and separated therefrom by a floating gate oxide;
- a plurality of buried bit lines formed of material and disposed below the pillars in the array memory cells for interconnecting with the first contact layer of column adjacent pillars in the array of memory cells;
- a plurality of control line separated from the floating gate by an insulator layer; and
- a plurality of data lines coupled to the second contact layer in row adjacent pillars.

30. The array of memory cell of claim 29, wherein the floating gate is formed in a trench below a top surface of each of the pillars such that the trench houses a pair of floating gates opposing the vertical body regions in column adjacent pillars on opposing sides of the trench, and wherein the pair of floating gates are separated by an insulator layer.

31. The array of memory cell of claim 30, wherein the plurality of control lines are formed in the trench below the top surface of the pillar and between the pair of floating gates, and wherein the floating gate includes a vertically oriented floating gate having a vertical length of less than 100 nanometers.

32. The array of memory cells of claim 30, wherein the plurality of control lines are disposed vertically above the floating gates.

33. The array of memory cells of claim 29, wherein the floating gate includes a horizontally oriented floating gate having a vertical side of less than 100 nanometers, and wherein the horizontally oriented floating gate is separated by a floating gate oxide from the vertical body regions on opposing sides of the trench for column adjacent pillars.

34. The array of memory cells of claim 29, wherein the plurality of control lines are disposed vertically above the floating gates.

35. The array of memory cells of claim 29, wherein each vertical transistor of pair of vertical transistors has a vertical length of less than 100 nanometers and a horizontal width of less than 10 nanometers.

36. A system comprising:
- a processor; and
- a memory device couple to the processor, wherein the memory device includes a memory cell array, and wherein each memory cell in the memory array includes;
    - a pillar extending outwardly from a substrate, wherein the pillar includes a first contact layer and a second contact layer separated by an oxide layer;
    - a vertical transistor formed along selected sides of the pillars, the vertical transistor including:
        - a vertical first source/drain region coupled to the first contact layer;
        - a vertical second source/drain region coupled to the second contact layer;
    - the vertical body region opposing the oxide layer and coupling the vertical first and second source/drain regions; and
        - a floating gate opposing the vertical body region and separated therefrom by a gate oxide;
- a plurality of buried bit lines formed of material and disposed below the pillars in the array memory cells for interconnecting with the first contact layer of column adjacent pillars in the array of memory cells; and a plurality of control lines separated from the floating gate by an insulator layer.

37. The system of claim 36, wherein the floating gate is formed in a trench below a top surface of the pillar.

38. The system of claim 36, herein the floating gate includes a horizontally oriented floating gate having a vertical side of less than 100 nanometers, and wherein the horizontally oriented floating gates are separated by a floating gate oxide from the vertical body regions on opposing sides of the trench or column adjacent pillars.

39. The system of claim 36, wherein the plurality of control lines are disposed vertically the floating gates.

40. The system of claim 36, wherein the vertical body region includes a p-type channel having a vertical length of less than 100 nanometers.

41. The system of claim 36, wherein each of the plurality of buried bit lines is separated by an oxide layer from the substrate.

42. The system of claim 36, wherein the floating gate includes a vertically oriented floating gate having a vertical length of less than 100 nanometers.

43. An system comprising:
 a processor; and
 a memory device including an array of memory cells coupled to the processor, wherein the array of memory cells includes:
  a number of pillars extending outwardly from a substrate, wherein each of the pillars includes a first contact layer and a second contact layer separated by an oxide layer;
 a pair of vertical transistors formed along opposing sides of each of the pillars, wherein each vertical transistor of pair of vertical transistors includes:
  a vertical first source/drain region coupled to the first contact layer;
  a vertical second source/drain region coupled to the second con act layer;
  a vertical body region formed alongside the oxide layer and coupling the vertical first and second source/drain regions;
  a floating gate opposing the vertical body region and separated the from by a floating gate oxide;
  wherein a horizontal junction depth for the vertical first and second vertical source/drain regions is much less than a vertical length of the vertical body region;
 a plurality of buried bit lines formed of material and disposed below the pillars in the array memory cells for interconnecting with the first contact layer of column adjacent pillars in the array of memory cells;
 a plurality of control lines separated from the floating gate by an insulator layer; and
 a plurality of data lines coupled to the second contact layer in row adjacent pillars.

44. The system of claim 43, wherein the floating gate is formed in a trench below a top surface of each of the pillars such that the trench houses a pair of floating gates opposing the vertical body regions in column adjacent pillars on opposing sides of the trench, and wherein the pair of floating gates are separated by an insulator layer.

45. The system of claim 44, wherein the plurality of control lines are formed in the trench below the top surface of the pillar and between the pair of floating gates, and wherein the floating gate includes a vertically oriented floating gate having a vertical length of less than 100 nanometers.

46. The system of claim 44, wherein the plurality of control lines are disposed vertically above the floating gates.

47. The system of claim 43, wherein the floating gate includes a horizontally oriented floating gate having a vertical side of less than 100 nanometers, and wherein the horizontally oriented floating gate is separated by a floating gate oxide from the vertical body regions on opposing sides of the trench for column adjacent pillars.

48. The system of claim 43, wherein the plurality of control lines are disposed vertically above the floating gates.

49. The system of claim 43, wherein each vertical transistor of pair of vertical transistors has a vertical length of less than 100 nanometers and a horizontal width of less than 10 nanometers.

* * * * *

UNITED STATES PATENT AND TRADEMARK OFFICE
CERTIFICATE OF CORRECTION

PATENT NO.   : 6,639,268 B2
DATED        : October 28, 2003
INVENTOR(S)  : Leonard Forbes and Kie Y. Ahn It is certified that error appears in the above-identified patent and that said Letters Patent is hereby corrected as shown below:

<u>Column 4,</u>
Line 15, delete "an" before "ultra".

<u>Column 12,</u>
Line 64, delete "know" and insert -- known -- therefor.
Line 66, delete "can" before "then".

<u>Column 15,</u>
Line 51, delete "therefore" and insert -- therefrom -- therefor.

<u>Column 17,</u>
Line 41, delete "cell" and insert -- cells -- therefor.

<u>Column 18,</u>
Line 12, delete "line" and insert -- lines -- therefor.
Line 22, delete "cell" and insert -- cells -- therefor.

<u>Column 19,</u>
Line 5, delete "herein" and insert -- wherein -- therefor.
Line 10, delete "or" and insert -- for -- therefor.
Line 12, insert -- above -- after "vertically".
Line 37, delete "con act" and insert -- contact -- therefor.

<u>Column 20,</u>
Line 2, delete "the form" and insert -- therefrom -- therefor.

Signed and Sealed this

Fifteenth Day of June, 2004

JON W. DUDAS
*Acting Director of the United States Patent and Trademark Office*